(12) United States Patent
Sachet et al.

(10) Patent No.: US 10,741,649 B2
(45) Date of Patent: Aug. 11, 2020

(54) HIGH MOBILITY DOPED METAL OXIDE THIN FILMS AND REACTIVE PHYSICAL VAPOR DEPOSITION METHODS OF FABRICATING THE SAME

(71) Applicant: North Carolina State University, Raleigh, NC (US)

(72) Inventors: Edward Sachet, Raleigh, NC (US); Christopher Shelton, Raleigh, NC (US); Jon-Paul Maria, Raleigh, NC (US); Kyle Patrick Kelley, Lake Lure, NC (US); Evan Lars Runnerstrom, Durham, NC (US)

(73) Assignee: NORTH CAROLINA STATE UNIVERSITY, Raleigh, NC (US)

( * ) Notice: Subject to any disclaimer, the term of this patent is extended or adjusted under 35 U.S.C. 154(b) by 0 days.

(21) Appl. No.: 15/988,883

(22) Filed: May 24, 2018

(65) Prior Publication Data

US 2018/0350922 A1    Dec. 6, 2018

Related U.S. Application Data

(60) Provisional application No. 62/513,090, filed on May 31, 2017.

(51) Int. Cl.
*H01L 29/267*    (2006.01)
*C23C 14/08*    (2006.01)
(Continued)

(52) U.S. Cl.
CPC ........ *H01L 29/267* (2013.01); *C23C 14/0042* (2013.01); *C23C 14/0057* (2013.01);
(Continued)

(58) Field of Classification Search
CPC .............. H01L 21/02; H01L 21/02266; H01L 21/02565; H01L 21/02631; H01L 21/477
See application file for complete search history.

(56) References Cited

U.S. PATENT DOCUMENTS 7,863,087 B1 * 1/2011 Kumar ................ H01L 45/1625
257/E21.078
2010/0127255 A1    5/2010 Allen et al.
(Continued)

OTHER PUBLICATIONS

Sachet et al. "Mid-infrared surface plasmon resonance in zinc oxide semiconductor thin films" Appl. Phys. Lett. 102 (5):051111-051111-4 (2013).
(Continued)

*Primary Examiner* — Cuong Q Nguyen
(74) *Attorney, Agent, or Firm* — Myers Bigel, P.A.

(57) ABSTRACT

A method of forming a metal oxide includes providing a reactive deposition atmosphere having an oxygen concentration of greater than about 20 percent in a chamber including a substrate therein. A pulsed DC signal is applied to a sputtering target comprising a metal, to sputter metal particles therefrom. A doping element may be supplied from a doping source (such as an alloyed metal target) in the reaction chamber. An electrically conductive metal oxide film comprising an oxide of the metal is deposited on the substrate responsive to a reaction between the metal particles and the reactive deposition atmosphere. Related devices are also discussed.

16 Claims, 14 Drawing Sheets

(51) Int. Cl.

| | |
|---|---|
| H01L 21/02 | (2006.01) |
| H01L 21/477 | (2006.01) |
| C23C 14/35 | (2006.01) |
| C23C 14/54 | (2006.01) |
| C23C 14/34 | (2006.01) |
| C23C 14/00 | (2006.01) |
| H01L 31/0224 | (2006.01) |
| H01L 29/45 | (2006.01) |
| H01L 29/786 | (2006.01) |

(52) U.S. Cl.
CPC .......... *C23C 14/086* (2013.01); *C23C 14/345* (2013.01); *C23C 14/3485* (2013.01); *C23C 14/35* (2013.01); *C23C 14/352* (2013.01); *C23C 14/548* (2013.01); *H01L 21/02266* (2013.01); *H01L 21/477* (2013.01); *H01L 29/45* (2013.01); *H01L 29/458* (2013.01); *H01L 31/022466* (2013.01); H01L 29/7869 (2013.01)

(56) References Cited

U.S. PATENT DOCUMENTS

| | | |
|---|---|---|
| 2012/0139074 A1 | 6/2012 | Abe |
| 2014/0060643 A1 | 3/2014 | Martin et al. |
| 2016/0211475 A1 | 7/2016 | Chaki Roy et al. |
| 2016/0322530 A1 | 11/2016 | Sachet et al. |
| 2017/0084399 A1 | 3/2017 | Vak |

OTHER PUBLICATIONS

Sachet et al. "Dysprosium doped cadmium oxide as a gateway material for mid-infrared plasmonics" Nature Materials 14(4):414-420 (2015).
Alemi et al. "Sol-gel synthesis, characterization, and optical properties of Gd3+-doped CdO sub-micron materials" International Nano Letters 3(41):1-6 (2013).
Ali et al. "Sn doped ZnO Thin Films Prepared by Pulsed Laser Deposition for Photovoltaic Applications" Int. J. Thin. Film Sci. Tec. 3(3):107-111 (2014).
Carballeda-Galicia et al. "High transmittance CdO thin films obtained by the sol-gel method" Thin Solid Films 371:105-108 (2000).
Ellis et al. "MOCVD of highly conductive CdO thin films" Journal of Materials Science: Materials in Electronics 15:369-372 (2004).
Gurumurugan et al. "DC reactive magnetron sputtered CdO thin films" Material Letters 28:307-312 (1996).
Huerta-Barbera et al. "MOCVD growth of CdO very thin films: Problems and ways of solution" Applied Surface Science 385:209-215 (2016).
Li et al. "Structural, optical, and electrical properties of low-concentration Ga-doped CdO thin films by pulsed laser deposition" J Mater Sci 51:7179-7185 (2016).
Sankarasubramanian et al. "Chemical spray pyrolysis deposition of transparent and conducting Fe doped CdO thin films for ethanol sensor" Materials Science in Semiconductor Processing 40:879-844 (2015).
Yan et al. "Highly Conductive Epitaxial CdO Thin Films Prepared by Pulsed Laser Deposition" Appl. Phys. Lett. 78 (16):2342-2344 (2001).
Yang et al. "CdO as the Archetypical Transparent Conducting Oxide. Systematics of Dopant Ionic Radius and Electronic Structure Effects on Charge Transport and Band Structure" J. Am. Chem. Soc. 127(24):8796-8804 (2005).
Yu et al. "Defects and Properties of Cadmium Oxide Based Transparent Conductors" J. Appl. Phys. 119:181501 (2016).
Zhu et al. "Transparent and conductive indium doped cadmium oxide thin films prepared by pulsed filtered cathodic arc deposition" Applied Surface Science 265:738-744 (2013).

Naik et al. "Alternative Plasmonic Materials: Beyond Gold and Silver" Adv. Mater. 25(24):3264-3294 (2013).
Soltasseva et al. "Low-Loss Plasmonic Metamaterials" Science 331(6015):290-291 (2011).
Noginov et al. "Transparent Conductive Oxides: Plasmonic Materials for Telecom Wavelengths" Appl. Phys. Lett. 99 (2):021101 (2011).
Losego et al. "Conductive Oxide Thin Films: Model Systems for Understanding and Controlling Surface Plasmon Resonance" J. Appl. Phys. 106(2):024903 (2009).
Pendry et al. "Mimicking Surface Plasmons with Structured Surfaces" Science 305(5685):847-848 (2004).
Runnerstrom et al. "Defect Engineering in Plasmonic Metal Oxide Nanocrystals" Nano Lett. 16:3390-3398 (2016).
Lounis et al. "Influence of Dopant Distribution on the Plasmonic Properties of Indium Tin Oxide Nanocrystals" J. Am. Chem. Soc. 136(19):7110-7116 (2014).
Coutts et al. "Search for Improved Transparent Conducting Oxides: a Fundamental Investigation of CdO, Cd2SnO4, and Zn2SnO4" J. Vac. Sci. Technol. A 18(6):2646-2660 (2000).
Wang et al. "Indium-Cadmium-Oxide Films Having Exceptional Electrical Conductivity and Optical Transparency: Clues for Optimizing Transparent Conductors" Proc. Natl. Acad. Sci. 98(13):7113-7116 (2001).
Kelley et al. "High Mobility Yttrium Doped Cadmium Oxide Thin Films" APL Materials 5(7):31813 (2017).
Shannon "Revised Effective Ionic Radii and Systematic Studies of Interatomic Distances in Halides and Chalcogenides" Acta Cryst A 32(5):751-767 (1976).
Diroll et al. "Large Transient Optical Modulation of Epsilon-Near-Zero Colloidal Nanocrystals" ACS Nano 10:10099-10105 (2016).
Rakhshani et al. "Electronic and Optical Properties of Fluorine-Doped Tin Oxide Films" J. Appl. Phys. 83(2):1049-1057 (1998).
Stjerna et al. "Optical and Electrical Properties of Radio Frequency Sputtered Tin Oxide Films Doped with Oxygen Vacancies, F, Sb, or Mo" J. Appl. Phys. 76(6):3797-3817 (1994).
Li et al. "Selection Rule of Preferred Doping Site for N-Type Oxides" Appl. Phys. Lett. 100(26):262109 (2012).
Campione et al. "Near-Infrared Strong Coupling Between Metamaterials and Epsilon-Near-Zero Modes in Degenerately Doped Semiconductor Nanolayers" ACS Photonics 3(2):293-297 (2016).
Campione et al. "Epsilon-Near-Zero Modes for Tailored Light-Matter Interaction" Phys. Rev. Applied 4(4):044011 (2015).
Luk et al. "Directional Perfect Absorption Using Deep Subwavelength Low-Permittivity Films" Phys. Rev. B 90 (8):085411 (2014).
Yoon et al. "Broadband Epsilon-Near-Zero Perfect Absorption in the Near-Infrared" Sci. Rep. 5:12788 (2015).
Manjavacas et al. "Plasmon-Induced Hot Carriers in Metallic Nanoparticles" ACS Nano 8(8):7630-7638 (2014).
Boltasseva et al. "Empowering plasmonics and metamaterials technology with new material platforms" MRS Bulletin 39(5):461-468 (2014).
Atwater et al. "Plasmonics for improved photovoltaic devices" Nature Materials 9:205-213 (2010).
Cerruti et al. "Influence of indium-tin oxide surface structure on the ordering and coverage of carboxylic acid and thiol monolayers" J. Phys. D: Appl. Phys. 40(14):4212-4221 (2007).
Knight et al. "Photodetection with Active Optical Antennas" Science 332(6030):702-704 (2011).
"Room Temperature Vs. LN2-Cooled Detectors Infrared Microscopy Cost/Performance Analysis" Thermo Scientific, Technical Note 51513 ((c)2008-2013).
Stanley "Plasmonics in the Mid-Infrared" Nature Photonics 6(7):409-411 (2012).
Ellmer "Past Achievements and Future Challenges in the Development of Optically Transparent Electrodes" Nature Photon. 6(12):809-817 (2012).
Lounis et al. "Defect Chemistry and Plasmon Physics of Colloidal Metal Oxide Nanocrystals" J. Phys. Chem. Lett, 5 (9):1564-1574 (2014).
Bhachu et al. "Origin of High Mobility in Molybdenum-Doped Indium Oxide" Chem, Mater. 27:2768-2796 (2015).

(56) References Cited

OTHER PUBLICATIONS

Calnan et al. "High Mobility Transparent Conducting Oxides for Thin Film Solar Cells" Thin Solid Films 518(7):1839-1849 (2010).
Gordon et al. "Shape-Dependent Plasmonic Response and Directed Self-Assembly in a New Semiconductor Building Block, Indium-Doped Cadmium Oxide (ICO)" Nano Lett. 13(6)2857-2863 (2013).
Jin et al. "Dopant Ion Size and Electronic Structure Effects on Transparent Conducting Oxides. Sc-Doped CdO Thin Films Grown by MOCVD" J. Am. Chem. Soc. 126(42):13787-13793 (2004).
Liu et al. "Infrared Spatial and Frequency Selective Metamaterial with Near-Unity Absorbance" Phys. Rev. Lett. 104 (20):207403 (2010).
Liu et al. "Infrared Perfect Absorber and Its Application as Plasmonic Sensor" Nano Lett. 10(7):2342-2348 (2010).
Cooper et al. "Mid-Infrared Localized Plasmons Through Structural Control of Gold and Silver Nanocrescents" J. Phys. Chem. C 119(21):11826-11832 (2015).
Liu et al. "Effects of Free Carriers on the Optical Properties of Doped CdO for Full-Spectrum Photovoltaics" Phys. Rev. Applied 6:064018 (2016).
Santos-Cruz et al. "Optical and Electrical Characterization of Fluorine Doped Cadmium Oxide Thin Films Prepared by the Sol-Gel Method" Thin Solid Films 515(13):5381-5385 (2007).
Deokate et al. "Spray Deposition of Highly Transparent Fluorine Doped Cadmium Oxide Thin Films" Applied Surface Science 254(7)2187-2195 (2008).
Ye et al. "Expanding the Spectral Tunability of Plasmonic Resonances in Doped Metal-Oxide Nanocrystals Through Cooperative Cation-Anion Codoping" J. Am. Chem. Soc. 136(33):11680-11686 (2014).
Mientus et al. "Structural, Electrical and Optical Properties of Sn02-X:F-Layers Deposited by DC-Reactive Magnetron-Sputtering From a Metallic Target in Ar—O2/CF4 Mixtures" Surface and Coatings Technology 98 (1-3):1267-1271 (1998).
Campione et al. "Theory of Epsilon-Near-Zero Modes in Ultrathin Films" Physical Review B 91(12):121408 (2015).
Burbano et al. "Sources of Conductivity and Doping Limits in CdO from Hybrid Density Functional Theory" Journal of the American Chemical Society 133(38):15065-15072 (2011).
Sobhani et al. "Narrowband photodetection in the near-infrared with a plasmon-induced hot electron device" Nature Communications 4(1643):1-6 (2013).
Anders "Tutorial: Reactive high power impulse magnetron sputtering (R-HiPIMS)" J. Appl. Phys. 121:171101 (2017).
Babu et al. "Transparent conductive cadmium indate thin films prepared by dc magnetron sputtering" Materials Chemistry and Physics 78(1):208-213 (Feb. 2003).
Fenske et al. "Transparent conductive ZnO:Al films by reactive co-sputtering from separate metallic Zn and Al targets" Thin Solid Films 343-344:130-133 (Apr. 1999).
Hala et al. "Hysteresis-free deposition of niobium oxide films by HiPIMS using different pulse management strategies" J. Phys. D: Appl. Phys. 45(5):055204 (Jan. 2012).
Smith, Donald L. "Thin-Film Deposition: Principles and Practice" (pp. 479-481) (1995).
Subramanyam et al. "Preparation and characterization of CdO films deposited by dc magnetron reactive sputtering" Material Letters 35(3-4):214-220 (May 1998).
Zhou et al. "Low resistivity transparent conducting CdO thin films deposited by DC reactive magnetron sputtering at room temperature" Materials Letters 61(2):531-534 (Jan. 2007).

\* cited by examiner

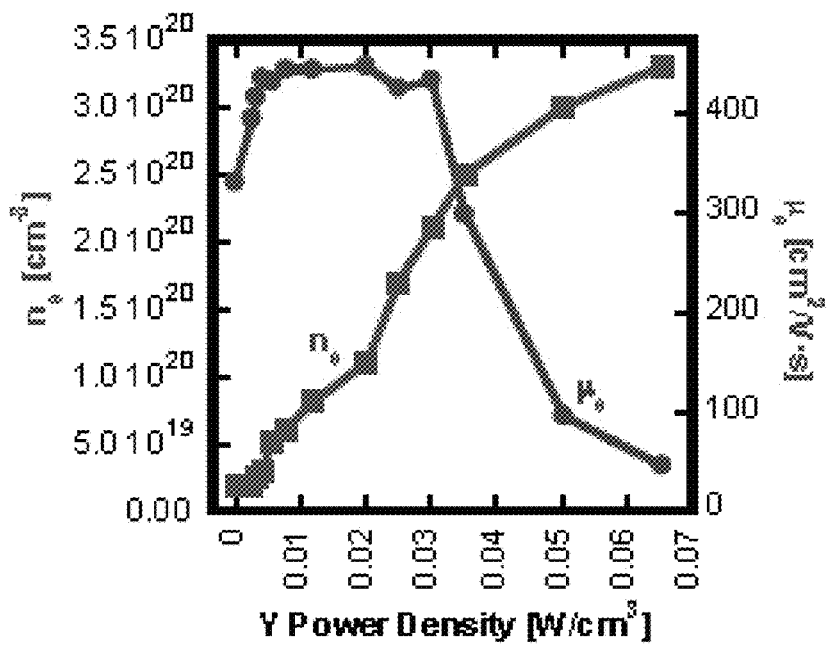
*FIG. 4*
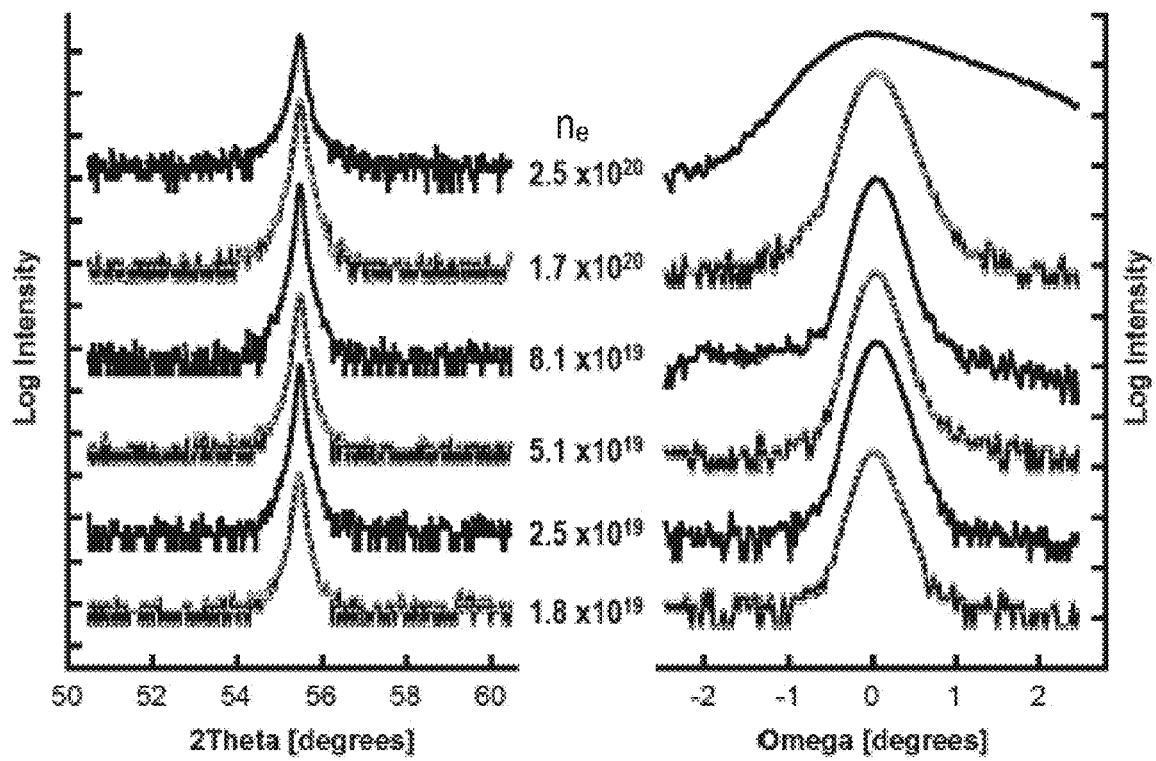
*FIG. 5A*     *FIG. 5B*

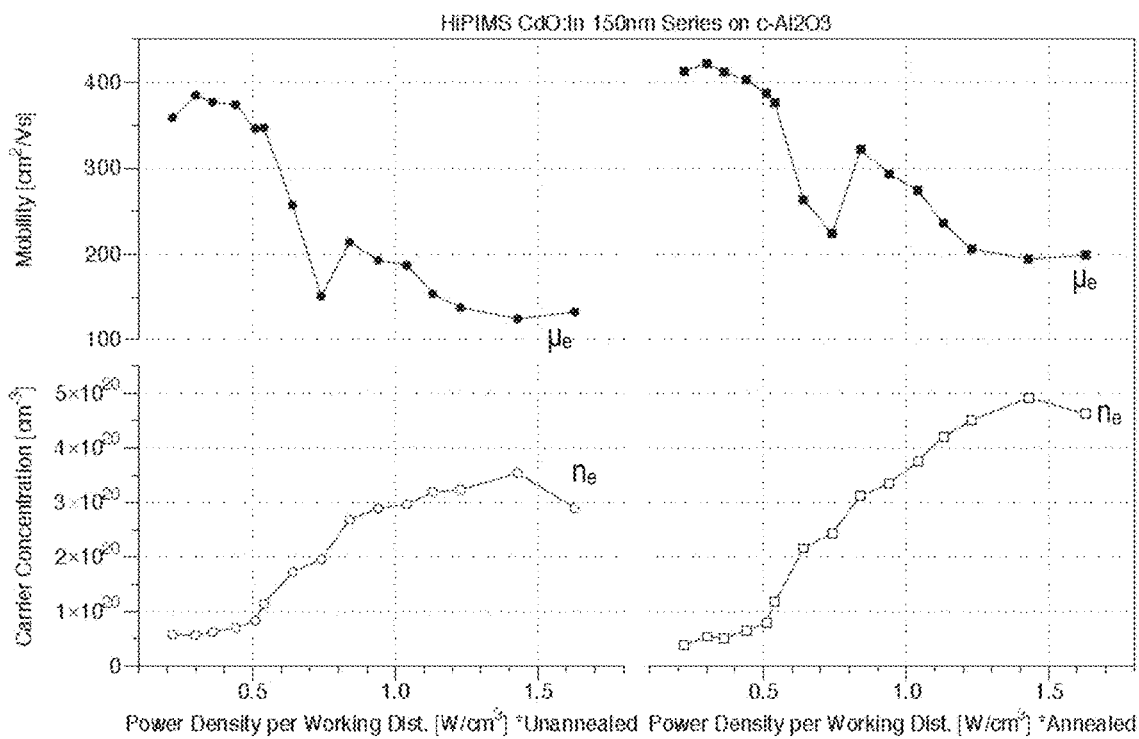
FIG. 8A  FIG. 8B
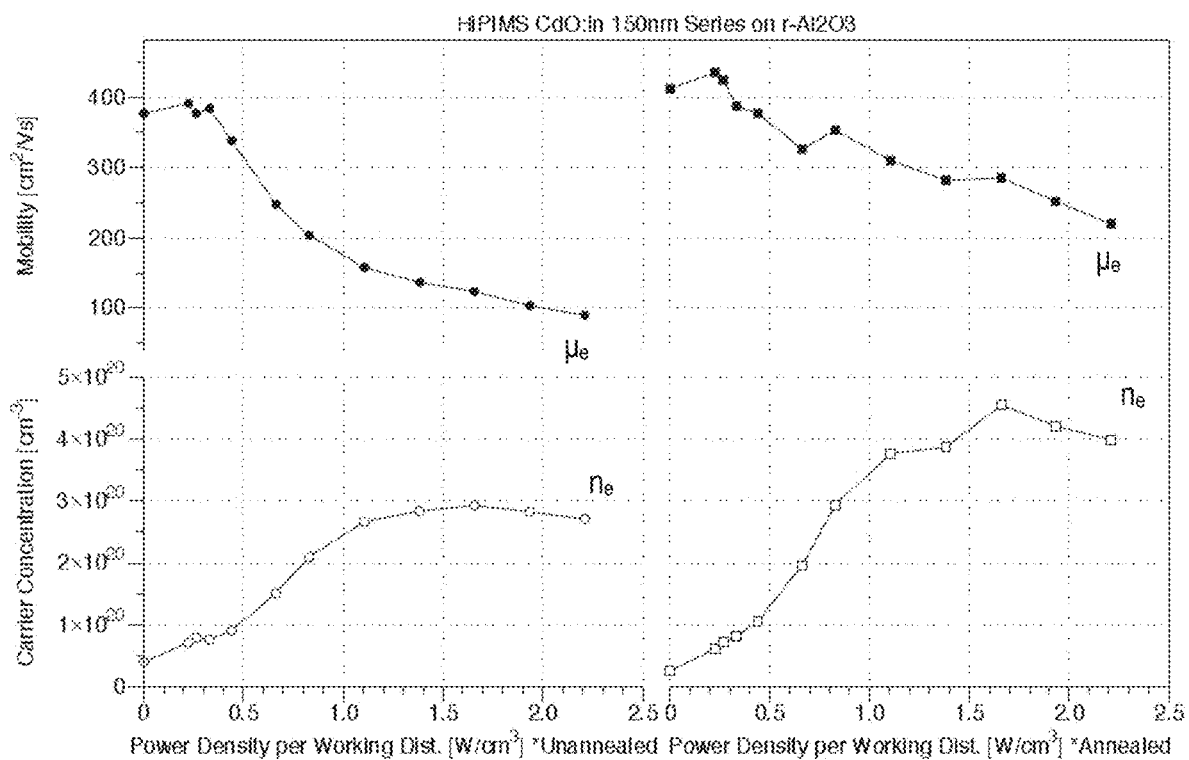
FIG. 9A  FIG. 9B

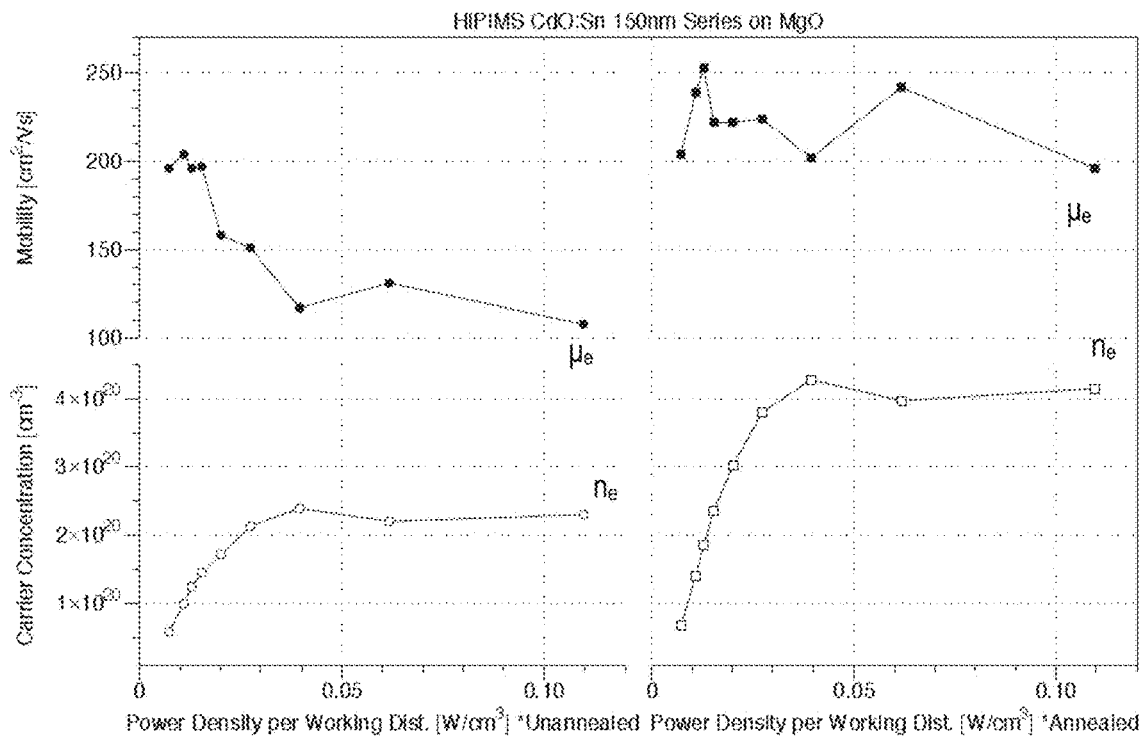
FIG. 12A  FIG. 12B
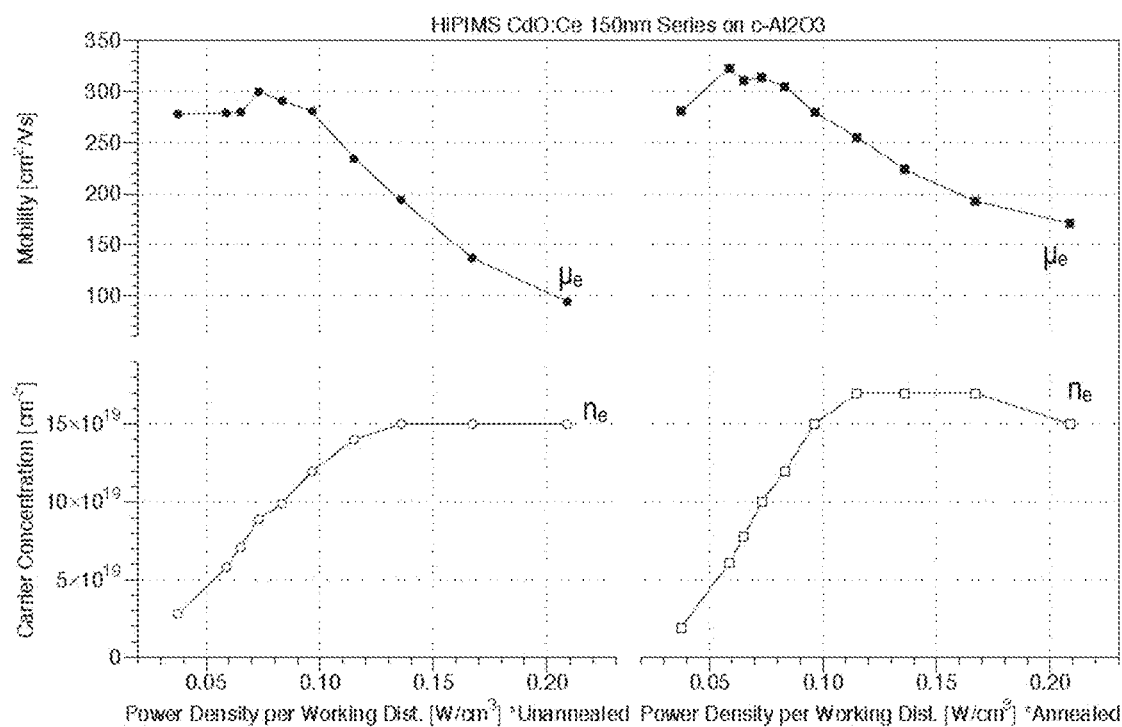
FIG. 13A  FIG. 13B

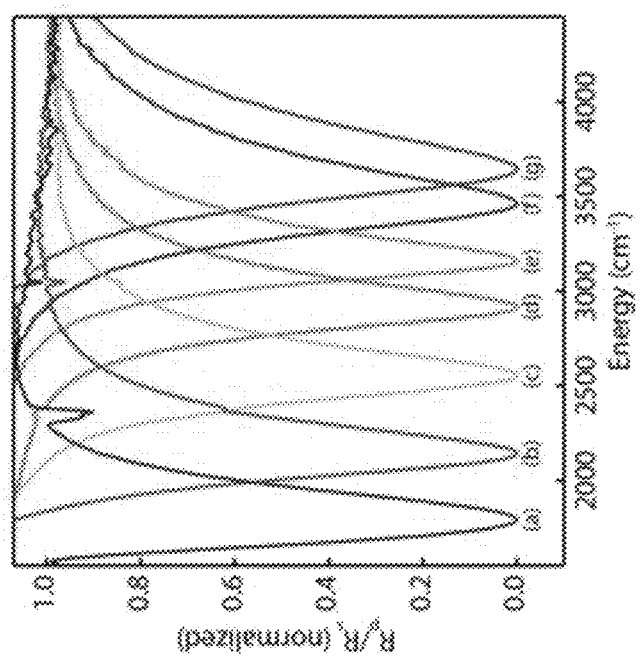
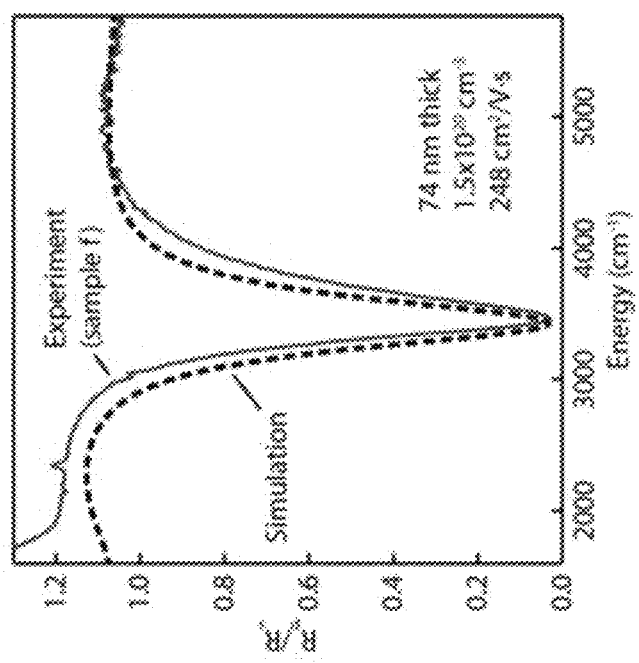
FIG. 20B
FIG. 20A

US 10,741,649 B2

HIGH MOBILITY DOPED METAL OXIDE THIN FILMS AND REACTIVE PHYSICAL VAPOR DEPOSITION METHODS OF FABRICATING THE SAME

CLAIM OF PRIORITY

This application claims priority under 35 U.S.C. § 119 to U.S. Patent Application No. 62/513,090, filed May 31, 2017 and entitled "HIGH MOBILITY DOPED METAL OXIDE THIN FILMS AND REACTIVE PHYSICAL VAPOR DEPOSITION METHODS OF FABRICATING THE SAME", the disclosure of which is incorporated by reference herein in its entirety.

STATEMENT OF GOVERNMENT INTEREST

This invention was made with government support under grant number 1507947 awarded by the National Science Foundation and grant numbers W911NF-16-1-0406 and W911NF-16-1-0037 awarded by the Army Research Office. The government has certain rights to this invention.

BACKGROUND

Conductive metal oxides have been investigated in the context of electronic, plasmonics, and optical technologies. Some interest in plasmonic technologies may be based on emergent optoelectronic applications, such as plasmon lasers, transistors, sensors, and information storage. While plasmonic materials, such as gold and ITO, have been found for use in UV-VIS and near infrared wavelength ranges, the mid-infrared wavelength range may be more challenging to address, for example, due to lower free carrier mobility values (i.e., higher plasmonic loss) that may be common in conductors with carrier concentrations that support plasmonic resonance in the infrared wavelength range.

Electron mobilities surpassing 500 cm$^2$/(V·s) at carrier densities greater than $5 \times 10^{19}$ cm$^{-3}$ have been demonstrated in dysprosium (Dy)-doped cadmium oxide (CdO) (notated herein as CdO:Dy). These transport properties can satisfy the criteria for mid-infrared spectrum plasmonics, and can overcome the optical losses seen in some conventional conductors, such as noble metals.

Molecular beam epitaxy (MBE) may allow for precision doping to achieve such properties. However, the sophistication of MBE instrumentation may present some barriers with respect to material implementation. As such, alternative process methods to manufacture doped cadmium oxide thin films, such as metal-organic vapor phase-epitaxy, pulsed laser deposition, colloidal nanocrystals, and radio frequency sputtering, have been explored.

SUMMARY

According to some embodiments described herein, in a method of forming a metal oxide, a reactive deposition atmosphere comprising an oxygen concentration of greater than about 20 percent is provided in a reaction chamber including a substrate therein. A pulsed DC signal is applied to a sputtering source comprising a metal (such as a metal target) in the reaction chamber, to sputter metal particles therefrom. A doping element may be supplied from a doping source (such as an alloyed metal target) in the reaction chamber. An electrically conductive metal oxide film comprising an oxide of the metal is deposited on the substrate responsive to a reaction between the metal particles, the reactive deposition atmosphere, and/or the doping element.

According to some embodiments described herein, a device includes an electrically conductive metal oxide film comprising a carrier concentration of about the intrinsic n-type carrier concentration ($<0.8 \times 10^{19}$) to about $5 \times 10^{20}$ cm$^{-3}$, and a carrier mobility of about 100-550 cm$^2$/(V·s). The conductive metal oxide film may have a thickness of about 10 nm to about 3 μm, and an RMS roughness of about 5 nanometers or less.

According to some embodiments described herein, a device includes an electrically conductive metal oxide film comprising a carrier concentration of about $5 \times 10^{19}$ to about $2 \times 10^{20}$ cm$^{-3}$ and a carrier mobility of about 300-550 cm$^2$/(V·s). The conductive metal oxide film is formed by providing a reactive deposition atmosphere comprising an oxygen concentration of greater than about 20 percent in a chamber having a substrate therein, applying a pulsed DC signal to a sputtering target comprising a metal to sputter metal particles therefrom, and depositing the conductive metal oxide film comprising an oxide of the metal on the substrate responsive to a reaction between the metal particles and the reactive deposition atmosphere.

Other devices and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIG. 4 is a graph illustrating carrier concentration and carrier mobility as a function of magnetron power density and cathode to substrate distance in CdO thin films according to some embodiments described herein.

FIGS. 5A-5B are graphs illustrating x-ray diffraction data for CdO:Y thin films as a function of carrier concentration in accordance with some embodiments described herein.

FIGS. 8A-8B are graphs illustrating characteristics of a 150 nm thick CdO:In film formed using a deposition process in accordance with some embodiments described herein on a c-plane sapphire substrate.

FIGS. 9A-9B are graphs illustrating characteristics of a 150 nm thick CdO:In film formed using a deposition process in accordance with some embodiments described herein on an r-plane sapphire substrate.

FIGS. 12A-12B are graphs illustrating characteristics of a 150 nm thick CdO:Sn film formed using a deposition process in accordance with some embodiments described herein on an MgO substrate.

FIGS. 13A-13B are graphs illustrating characteristics of a 150 nm thick CdO:Ce film formed using a deposition process in accordance with some embodiments described herein on a c-plane sapphire substrate.

FIG. 20A is a graph illustrating simulated and experimentally measured reflectivity curves for a CdO:F film in accordance with some embodiments described herein.

FIG. 20B is a graph illustrating experimental reflectivity curves for several CdO:F films with varying carrier concentration in accordance with some embodiments described herein.

DETAILED DESCRIPTION

Figure 1:
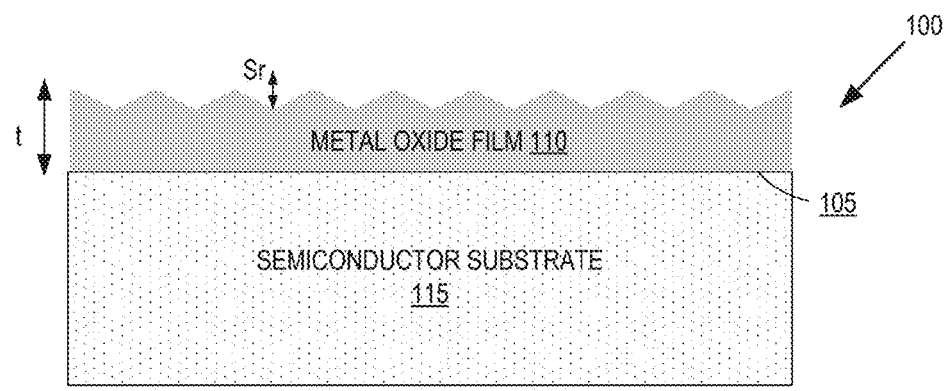
FIG. 1 is a block diagram illustrating a device including a conductive metal oxide film fabricated in accordance with some embodiments described herein.

Embodiments of the present disclosure may arise from interest in achieving material properties typically associated with fabrication by molecular beam epitaxy (MBE) using alternative deposition methods. For example, some cadmium oxide (CdO) thin films with desirable transport properties (for example, based on carrier concentration and carrier mobility) have been fabricated using molecular beam epitaxy (MBE). The precision doping afforded by oxide MBE provides a background for understanding relationships between composition, defect chemistry, and electronic transport, for example, in CdO:Dy. However, MBE may be relatively costly and time consuming on a per-run basis, and may not be readily upscaleable. Moreover, for CdO:Dy, some conventional alternative process methods may be unable to duplicate the reported property trends of CdO:Dy in the similarly low concentration regime ($<1\times10^{20}$ cm$^{-3}$) that may be needed to identify salient defect chemistry trends and achieve desirable transport and optical properties.

Embodiments described herein provide fabrication methods (and films produced thereby) that allow for cheaper and faster deposition of CdO and/or other conductive metal oxide thin films with approximately 90% or more of the properties demonstrated using MBE. In the short term, fabrication techniques in accordance with embodiments described herein can increase internal research and development throughput and reduce development cost. Mid- to long-term, fabrication techniques in accordance with embodiments described herein may offer a scaleable approach to manufacture CdO and/or other conductive metal oxide thin film-based technologies while providing access to the high quality materials that may be needed in these applications. Furthermore, embodiments described herein can provide property improvement and/or optimization with fabrication techniques based on non-equilibrium processing conditions and/or higher pressures, temperatures, and/or power densities.

Embodiments described herein provide reactive physical vapor deposition (PVD) processes that enable thin film deposition of conductive metal oxides, such as doped cadmium oxide (CdO). In particular embodiments described herein, a high-power impulse magnetron sputtering (HiPIMS)-based reactive physical vapor deposition (PVD) process may provide a more upscaleable and commercially viable deposition technique for CdO and/or other conductive metal oxide thin films, as compared to producing such thin films via MBE.

For example, some embodiments described herein provide donor-doped CdO films prepared by HiPIMS, to achieve material quality similar to MBE fabrication in combination with the practicality and flexibility of a magnetron sputtering infrastructure. HiPIMS is adapted for use in a reactive deposition atmosphere to oxidize metallic cadmium (Cd) to cadmium oxide (CdO) and subsequently deposit thin films thereof on suitable substrates. Such a PVD method is scaleable and can be integrated with established complementary metal-oxide semiconductor (CMOS) and other thin film process flows.

HiPIMS based thin film depositions have been used in large volume applications such as hard coatings (TiN, CN$_x$), metallization (CMOS Cu, Ti, Ta), or optical coatings (ITO, TiO$_2$, etc.). Conventional magnetron sputtering plasmas may be sustained by either DC or radio frequency (RF) power, which is typically chosen based on the target resistivity. Deposition from pulsed DC plasmas can extend the power limitations typically imposed by target melting temperature or the magnetron depoling, provided the durations are short. For example, power densities on the order of 10 W/cm$^2$ may be conventionally used to sputter materials like HfO$_2$, In$_{1-x}$Sn$_x$O$_3$, and TiN, which may produce ionization fractions on the order of or below about 10%. However, a higher ionization fraction may be desired, for example, to increase oxidation in a reactive deposition, or to promote additional energetic bombardment.

As recognized by the present inventors, if ionization fractions exceed approximately 80%, a self-sputter regime can be reached where the bombarding species is primarily the target material (i.e., gasless sputtering). The power densities needed to access this ionization extreme may overheat some conventional cathodes if run continuously, but can be sustained when operated in pulsed mode. Imposing a duty cycle where the on-time of the pulsed signal is about 10% and the pulse duration is on the order of about 10-500 microseconds (p) can achieve this condition. During these short pulses, power densities on the order of kilowatts per square centimeter ($kW/cm^2$) or more can be achieved, leading to higher sputter rates, advantageous substrate bombardment, higher reactivity, denser as-deposited films, and a reduced surface roughness.

Embodiments described herein provide fabrication methods that allow for deposition of conductive metal oxide thin films (for example, CdO thin films) with controllable carrier concentrations and mobilities exceeding 400 $cm^2/(V \cdot s)$. Carrier concentration can be adjusted by various dopants, including (but not limited to) Ag, In, Ce, Sn, Y and F. Different doping elements allow access to different parameter spaces. For example, for CdO, indium (In) doping can allow for higher maximum carrier concentration while yttrium (Y) doping can provide films with higher mobilities at comparable carrier densities. More generally, embodiments described herein may allow for fabrication of conductive metal oxide layers with desired physical characteristics (including thickness/surface roughness) and electrical properties (including carrier concentration/mobility). Film characteristics and/or quality as described herein can be measured based on surface characteristics, structural characteristics (based on X-ray diffraction (XRD) and reflection (XRR)), electrical characteristics, and/or optical characteristics.

FIG. 1 is a block diagram illustrating a device 100 including a conductive metal oxide film 110 fabricated in accordance with some embodiments described herein. As shown in FIG. 1, an electrically conductive metal oxide thin film 110 is deposited on a substrate, semi-conducting substrate or insulating substrate 115. The conductive metal oxide film 110 may be transparent to visible light. For example, the conductive metal oxide film 110 may be CdO, $In_2O_3$, $SnO_2$, $BaSnO_3$, ZnO, IGZO, $Nb:SrTiO_3$, $SrRuO_3$, $RuO_3$, intrinsic and extrinsically doped, and may be deposited using pulsed DC-based reactive PVD methods (including HiPIMS-based PVD) described herein. The substrate 115 may be glass, quartz ($SiO_2$), sapphire (c-plane or r-plane), polycrystalline Alumina, MgO, Si, platinized Si, GaN, ZnO on c-plane sapphire, ZnO on Si, GaN on Si, or GaN on c-plane sapphire. In some embodiments, the conductive metal oxide film 110 may define a heterojunction 105 with the substrate 115, creating a Schottky-type barrier.

For example, the heterojunction 105 may be an all-oxide heterojunction (i.e., both sides 110 and 115 of the junction are formed of oxide materials) in some embodiments, where the metal oxide film side 110 of the heterojunction 105 is formed from a conducting metal oxide and the semiconductor substrate side 115 is formed from a semiconductor oxide. The oxides used in the device 100 may be wide bandgap oxides. The oxide of the semiconductor substrate side 115 may have a bandgap that is larger than the thermal energy of electrons at room temperature (i.e., Boltzmann constant multiplied by temperature ($k_BT=25.7$ meV@298 K)). Similarly, the height of the Schottky-type barrier formed between the metal oxide film side 110 and the semiconductor substrate side 115 of the heterojunction 105 may be larger than the thermal energy of electrons at room temperature. These properties of the device 100 may increase resistance to thermal noise at ambient room temperatures.

The conductive metal oxide film 110 may also have a carrier concentration (also referred to herein as carrier density) of greater than that of an intrinsic thin film of the same conductive metal oxide material. For example the metal oxide film side 110 of the heterojunction 105 may be formed from a conducting metal oxide doped with a metal, such as (but not limited to) silver (Ag), aluminum (Al), Yttrium (Y), indium (In), gallium (Ga), tin (Sn), fluorine (F), and the lanthanide series (including cerium (Ce), dysprosium (Dy), etc.). In some embodiments, the conductive metal oxide film 110 may be CdO, having a carrier concentration greater than that of intrinsic CdO ($<0.8 \times 10^{19}$ $cm^{-3}$), for example, a carrier concentration of about $5 \times 10^{19}$ to about $5 \times 10^{20}$ $cm^{-3}$. A CdO conductive metal oxide film 110 may also have a carrier mobility greater than that of intrinsic CdO (250 $cm^2/(V \cdot s)$), for example, a carrier mobility of about 300-550 $cm^2/(V \cdot s)$. This combination of carrier concentration and carrier mobility may be maintained even at lower thicknesses t of the metal oxide film 110. For example, the film thickness t may be about 10 nanometers (nm) to about 3 micrometers (μm), and may have a root means square (RMS) surface roughness Sr of about 5 nm or less.

In some embodiments, such high carrier mobility allows for lower optical or plasmonic losses in the infrared portion of the electromagnetic spectrum, and can enable the device 100 to function as a detector that can convert infrared radiation into an electrical signal at room temperature or convert thermal energy into emitted infrared radiation according to Kirchhoff's law of thermal radiation. In particular, the high carrier mobility in the conductive metal oxide film 110 fabricated in accordance with embodiments described herein may enable creation of low-loss and high-quality surface plasmon polaritions (SPPs) and other polariton modes supported by the thin film geometry. Incoming infrared photons may couple to SPPs and polaritons that are created on the metal oxide film side 110 of the heterojunction 105 (i.e., resonant oscillations of conduction band electrons resulting from surface plasmon resonance on the metal oxide film side 110 of the heterojunction 105). The SPPs and polaritons can increase the kinetic energy of electrons to create "hot" electrons on the metal oxide film side 110 of the heterojunction 105. For example, when infrared radiation is incident upon the metal oxide film side 110 of the heterojunction 105, conduction band electrons begin to oscillate and, upon decay, they produce hot electrons. Hot electrons in the conduction band of the metal oxide film side 110 having sufficient kinetic energy to cross the Schottky-type barrier are injected into the conduction band of the semiconductor substrate side 115 of the heterojunction 105. Once in the conduction band of the semiconductor, the electrons can be extracted with a voltage potential and detected as current, such that incoming infrared photons are converted to electrical signals. The band structure of the semiconductor substrate side 115 of the heterojunction 105 can be tailored to tune the height of the Schottky-type barrier by adjusting the relative ratios of compound semiconductor materials therein (e.g., the relative ratio of Cd and Mg in a CdMgO semiconductor substrate). Further description of conductive metal oxide films 110 described herein in heterojunction-based detectors is provided in U.S. Patent Application Publication No. 2016/0322530 to Sachet et al., entitled "OXIDE HETEROJUNC- TION FOR DETECTION OF INFRARED RADIATION," the disclosure of which is incorporated by reference herein.

In addition to fine-tuning the Schottky-type barrier height of the heterojunction 105, the wavelengths of radiation that the device 100 detects can be tuned by altering the metal oxide film side 110 of the heterojunction 105. For example, the wavelengths of radiation that are detectable by the device 100 can be controlled by adjusting the carrier concentration of the CdO material (doped with Y or other dopants) 110 formed in the deposition process, as described in greater detail herein.

Figure 2:
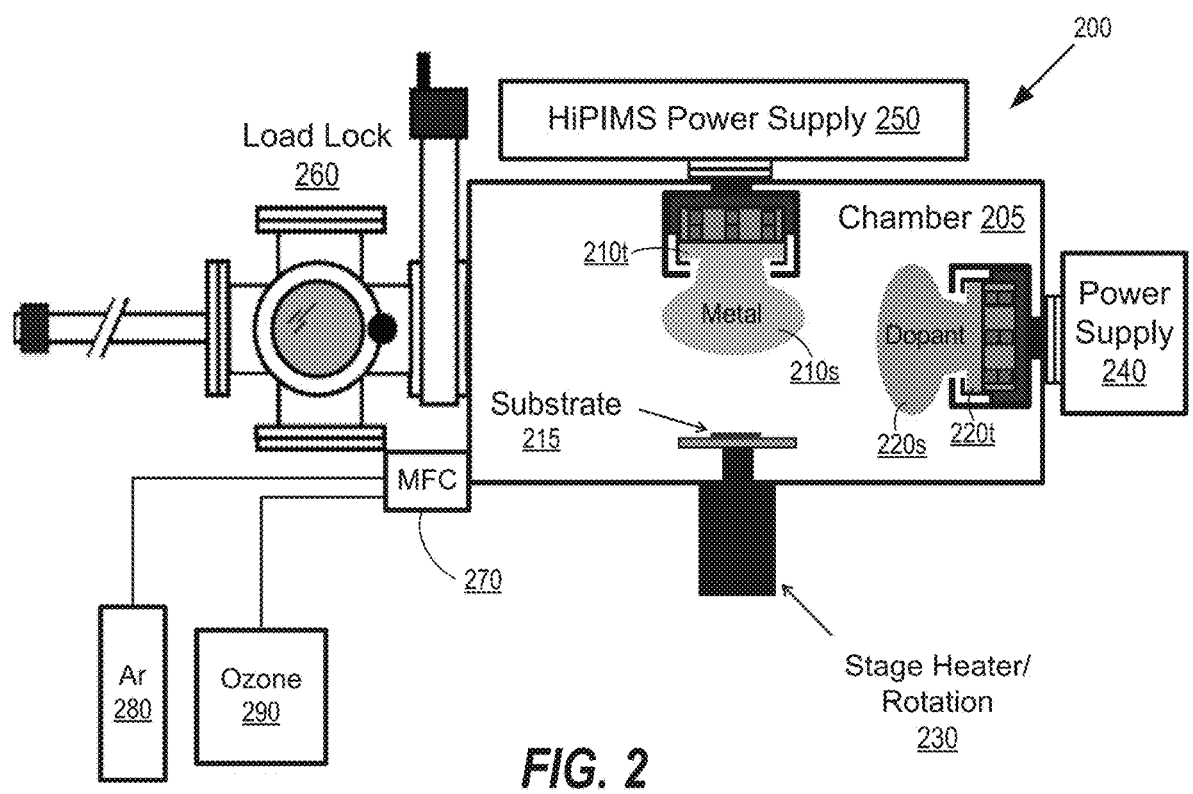
FIG. 2 is a block diagram illustrating an apparatus for fabricating conductive metal oxide films in accordance with some embodiments described herein.

FIG. 2 is a block diagram illustrating an apparatus 200 for fabricating conductive metal oxide films (such as the metal oxide film 110 of FIG. 1) in accordance with some embodiments described herein. As shown in FIG. 2, the apparatus includes a reaction chamber 205 having a stage heater and/or rotation mechanism 230 therein. A substrate 215 (such as the semiconductor substrate 115 of FIG. 1) is provided on the stage heater/rotation mechanism 230, and may be loaded into the reaction chamber 205 from a load lock chamber 260 that is connected to the reaction chamber 205. A metal source 210t and a doping source 220t are provided in the reaction chamber 205. The reactive deposition atmosphere within the reaction chamber 205 is controlled by a mass flow controller (MFC) 270, which may in some embodiments control a ratio of oxygen (O) and other gases (for example, argon (Ar)) introduced into the chamber 205 via sources 290 and 280, respectively.

In particular, fabrication processes as described herein are based on a metal target magnetron sputtering source 210t and a doping element magnetron sputtering source 220t combined in a ultra-high vacuum (UHV) deposition apparatus 200. The metal target 210t is driven by a HiPIMS sputtering power supply 250 to generate a high density plasma of the containing target metal ions 210s, while the solid-phase dopant 220t can be driven by a sputtering power supply 240 (which may be a radio-frequency (RF) or a HiPIMS power supply) to generate a plasma of the dopant ions 220s. In some embodiments, however, a gaseous organic or metal-organic doping source (e.g., $CF_4$) or indium isopropoxide (In-iOPr), can be used as the dopant 220t. This combination of metal and dopant sputtering is also referred to herein as reactive co-sputtering. In embodiments where the metal target 210t is cadmium (Cd), the HiPIMS deposition of the Cd, combined with a reactive deposition atmosphere ($Ar/O_2$ mixture with controlled ratio) enables oxidation of the metallic cadmium (providing cadmium oxide), due to the high energy ionization cascade provided by the HiPIMS sputtering. HiPIMS sputtering as described herein can allow for deposition rates of about 10 nanometers (nm) per minute or more, which may be faster than some conventional methods of growing CdO thin films (e.g., MBE, RF sputtering, PLD). For example, in some embodiments, deposition rates of between about 10 and 30 nm/min, or even 50 nm/min, may be achieved.

A bias voltage may be applied to the substrate 215 to influence the energy and direction of motion of the charged particles 210s, 220s that hit the substrate 215. The on-off/duty cycle of the signal provided by the HiPIMS sputtering power supply 250 has a period on the order of microseconds. Because the duty cycle is small (about 10% or less), and the pulse duration is on the order of about 10-500 μs, power densities on the order of kilowatts per square centimeter or more can be achieved.

Figure 3:
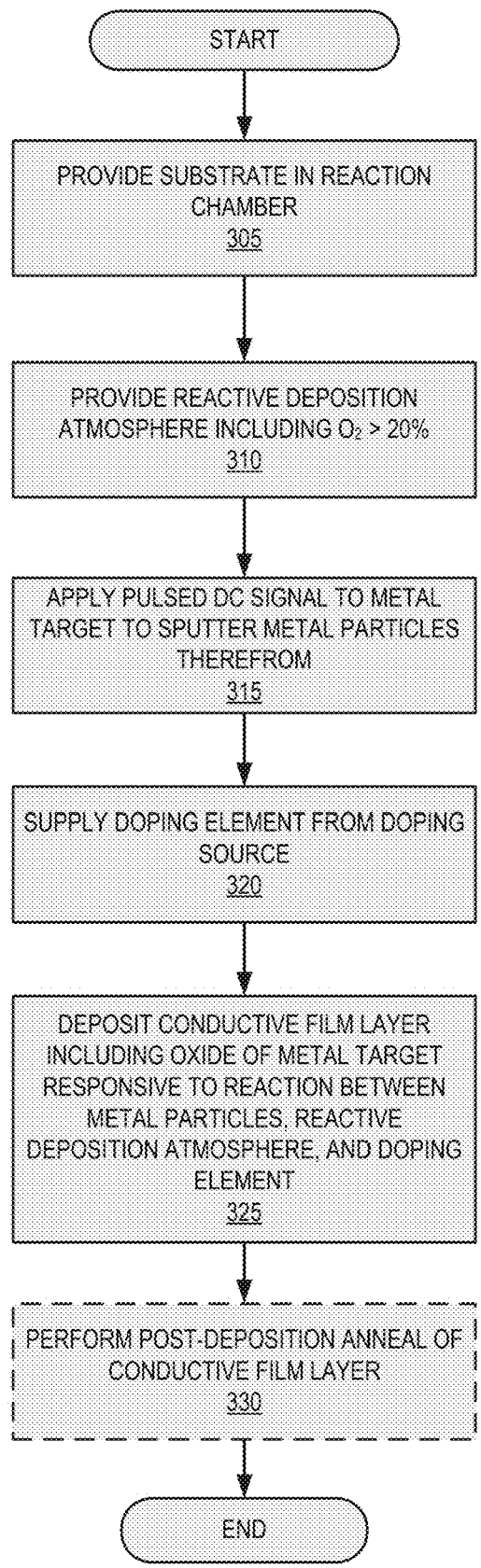
FIG. 3 is a flowchart illustrating methods of fabricating conductive metal oxide films in accordance with some embodiments described herein.

FIG. 3 is a flowchart illustrating methods of fabricating conductive metal oxide films in accordance with embodiments described herein. The flowchart of FIG. 3 will be described below with reference to the deposition apparatus 200 of FIG. 2 and the device 100 of FIG. 1; however, it will be understood that the operations illustrated in FIG. 3 are not limited to such apparatus/devices. Also, the operations of FIG. 3 are not limited to the order shown, and some operations may be performed concurrently or in a different order. Referring now to FIG. 3, a substrate 215 is provided in a reaction chamber 205 (block 305). The substrate 215 may be heated to a temperature from between room temperature to about 450 degrees Celsius (C) in some embodiments using the stage heater and/or rotation mechanism 230.

The chamber 205 is provided with a reactive deposition atmosphere including an oxygen concentration of greater than about 15 percent (block 310). For example, a mass flow controller 270 may be used to control the atmospheric conditions in the chamber 205. In particular, some embodiments described herein utilize a reactive deposition atmosphere that is oxygen-rich, and includes up to about 80% oxygen. For example, the reactive deposition atmosphere may include 60% argon or more, and more than 20%, more than 25%, or up to 40% oxygen. In contrast, some conventional deposition methods may use an oxygen concentration of 10-15%, as greater oxygen concentrations have previously been found to result in damage (e.g., etching of the target in RF sputtering or poisoning of the target in DC sputtering).

Still referring to FIG. 3, a pulsed direct current (DC) signal is applied to a metal sputtering source (shown in FIG. 2 as a solid-phase metal target 210t) to sputter metal particles 210s therefrom (block 315). The pulsed DC signal may be generated by a HiPIMS power supply 250. As compared to some conventional RF sputtering methods, reactive PVD using HiPIMS in accordance with embodiments described herein may result in a film having a greater density, a higher deposition rate, and a greater surface smoothness. Also, reactive PVD using HiPIMS in accordance with embodiments described herein may allow for self-sputtering of the metal target 210t and/or sputtering at a lower pressure (in some instances, up to 10 times lower pressure, for example, about 5-500 mTorr) as compared to some conventional RF sputtering methods. As described herein, in some embodiments the metal target 210t may be a cadmium (Cd) target. While some metals (such as Cd) may be more difficult to oxidize, the high energy ionization of the HiPIMS-generated plasma provided at block 315, in combination with the high oxygen concentration provided at block 310, may result in more effective oxidation of Cd than some conventional methods of CdO deposition.

Concurrently with the application of the pulsed DC signal at block 315, a doping element is supplied from a doping source 220t (block 320). The doping source 220t may be a solid-phase target (e.g., Ag, In, Ce, Sn, Y, or F-compound) or a gaseous phase halogenated organic or metal-organic doping source (e.g., $CF_4$ as a gas source and sublimed, In-acetylacetonate as a metal-organic source, In-iOPr). The doping element may be generated from the doping source 220t by RF sputtering or HiPIMS. For example, $CF_4$ or other gaseous doping source may be used in combination with a HiPIMS power supply to generate the doping ions 220s. The doping element may be selected to result in deposition of a conductive metal oxide 110 having one or more desired properties. For example, in deposition of a CdO film, indium (In) may be selected as a doping element in order produce increased (and, in some instances, highest) carrier concentrations in the deposited CdO film, while yttrium (Y) may be selected as a doping element to produce increased (and, in some instances, highest) carrier mobility in the deposited CdO film. In some embodiments, the concentration of the doping element may be relatively small (e.g., less than about 1%, or even less than about 0.01%).

Responsive to reaction between the metal particles 210s from the sputter target 210t (block 310), the reactive deposition atmosphere in the chamber 205 (block 315), and the doping element 220t (block 320), an electrically conductive film 110 including an oxide of the metal from the metal target 210t is deposited on the substrate 215 (block 325). In particular, the reaction between the metal particles, the reactive deposition atmosphere, and the doping element is configured to control carrier concentration and carrier mobility in the deposited metal oxide film 110, even at small thicknesses of about 10 nm to about 3000 nm. In contrast, some conventional methods may use an oxide target, rather than a metal target 210t, to deposit an oxide layer.

In some embodiments, a post-deposition anneal of the deposited conductive metal oxide film may 110 be performed (block 330). The post-deposition anneal may involve a temperature, a duration, and/or other atmospheric conditions that are configured to increase organization of a crystal structure of the film 110 (such as a reduction in diffraction peakwidth FWHM by about 5-50%), smooth surface properties of the film 110, reduce a carrier concentration of the film 110, and/or increase a carrier mobility of the film 110. For example, the post-deposition anneal may be performed at a temperature that is greater than the deposition temperature of the conductive metal oxide film 110. In particular, the post-deposition anneal may be performed at a temperature of up to about 700 degrees C., for instance a temperature in a range between about 450-700 degrees C.

The duration of the post-deposition anneal may not exceed about one hour, or in some embodiments, may not exceed about 30 minutes. For example, for some materials, film properties may worsen if the anneal is performed for more than about 30 minutes. In particular, a CdO film may, under conventional processing conditions (e.g. in vacuum), be destroyed at such temperatures. However, as CdO is stable in oxidative environments, the higher levels of oxygen provided by the atmospheric conditions at block 310 may reduce or prevent damage and/or destruction of the CdO film at these higher temperatures. Suitable annealing atmospheres can contain upwards of 20% $O_2$ (20-100% with $N_2$ or other inert gases, such as Ar, He, Ne as balance) at a pressure of roughly 1 atmosphere or higher. The maximum temperature for anneal may differ based on the material that was deposited, rather than a function of the deposition process. Effects of a post-deposition anneal on film characteristics as a function of time are described in greater detail with reference to FIG. 16.

Further controllable atmospheric conditions for the post-deposition anneal at block 330 may include, but are not limited to, a static or closed oxygen supply, a dynamic or flowing oxygen supply, a volume of the chamber, and/or a partial pressure of the chamber, for example under ultra-high vacuum (UHV) conditions. More generally, one or more characteristics of the post deposition anneal may provide results beyond that which may be typically expected. However, it will be understood that the post-deposition anneal at block 330 may not be performed in some embodiments described herein, for example, in embodiments where one or more transport properties of the sputtered material immediately after deposition (i.e., before exposure to a high temperature anneal) may be superior to those of fabricated by MBE processes. One such difference in the as-deposited, as-unannealed state can be a higher mobility in the undoped or low doping range. In particular, some films in the low $10^{19}$ doping concentration range may exhibit higher mobilities when deposited using HIPIMS as compared to MBE growth. Surface roughness may largely be a function of the substrate used in some embodiments.

Some embodiments are described herein with reference to experimental data based on the above and further fabrication methods. In particular, embodiments described herein may demonstrate that HiPIMS can enable fabrication of doped CdO thin films with crystal structure, surface roughness, and/or transport properties comparable to MBE-grown material, based on co-deposition of a donor dopant using an RF magnetron cathode source.

In some embodiments described herein, donor doped CdO thin films (shown in FIG. 1 as metal oxide film 110) on c-plane sapphire ($Al_2O_3$) (shown in FIG. 1 as semiconductor or wide-bandgap semiconductor substrate 115) are prepared by reactive co-sputtering from Cd-metal and Y-metal targets (shown in FIG. 2 as 210t and 220t, respectively). The Cd-metal and Y-metal targets are driven using pulsed DC power (provided in FIG. 2 by power supply 250) and RF power (provided in FIG. 2 by power supply 240), respectively. Intrinsic CdO typically exhibits a carrier density of <$0.8 \times 10^{19}$ cm$^{-3}$ and a mobility of about 250 cm$^2$/(V·s). By increasing the Y-flux in accordance with deposition methods described herein, carrier density values $n_e$ can be increased smoothly and reproducibly to up to about $3.3 \times 10^{20}$ cm$^{-3}$ or more. Carrier mobility $\mu_e$ also increases with Y-flux. As discussed in greater detail below with reference to FIG. 4, carrier mobility $\mu_e$ exhibits a broad plateau between carrier concentrations $n_e$ of about $5 \times 10^{19}$ cm-3 to about $2 \times 10^{20}$ cm$^{-3}$, but drops sharply as carrier concentrations $n_e$ increase above about $2 \times 10^{20}$ cm$^{-3}$. The increase in mobility $\mu_e$ can be attributed to a reduction of intrinsic donors (i.e., oxygen vacancies) with increasing carrier concentrations $n_e$ up to about $2 \times 10^{20}$ cm$^{-3}$, while the decrease in mobility $\mu_e$ as carrier concentrations $n_e$ increase above about $2 \times 10^{20}$ cm$^{-3}$ can result from a reduction in crystal quality, which may be associated with the solubility limit of Y in the CdO lattice, it is also possible that the production of intrinsic lattice defects, due to an increasing Fermi energy, with doping produces the reduction in mobility. Furthermore, at carrier concentrations approaching $5 \times 10^{20}$ cm$^{-3}$, electron-electron scattering (screening) becomes substantial and also lowers observable mobilities. Embodiments described herein thus demonstrate that CdO thin films can be prepared by magnetron sputtering with transport properties and crystal quality that are comparable to those grown using molecular beam epitaxy.

In particular embodiments described with reference to experimental data below, heteroepitaxial conductive metal oxide thin films of CdO:Y (having a thickness of about 150 nm) were prepared by reactive HiPIMS from a metallic Cd target (99.9999% metal basis) and by reactive RF sputtering from a metallic Y target (99.9+% metal basis). The magnetrons are oriented slightly outside the confocal point at a horizontal substrate in sputter-down geometry with an angle of incidence of approximately 30-60°, for example, 45°. The conductive metal oxide thin films were sputtered in an argon-oxygen environment at a pressure of about 10 mTorr, flowing about 19 standard cubic centimeter per minute (sccm) Ar and about 13 sccm $O_2$. The HiPIMS parameters were a frequency of about 800 Hz and pulse time of about 80 µs, resulting in a 1250 µs period and a 6.4% duty cycle. The HiPIMS plasma was driven by a pulsed power module and a 1.5 kV DC power supply (collectively illustrated as HiPIMS power supply 250 in FIG. 2), while the RF plasma was driven by an RF power supply and a manual impedance matching network (collectively illustrated as power supply 240 in FIG. 2). The DC power supply that feeds the HiPIMS unit was operated in constant voltage mode with a target value of about 400 V. Two-inch diameter cathodes were used for both metals, Cd and Y.

Doping was achieved by co-sputtering. Both the dopant target-to-substrate distance and the RF power were varied to modulate the dopant flux (and thus the carrier concentration) in the range of about 4-25 cm distance and about 0-10 W/cm$^2$ power density, respectively. These coupled parameters are quantified herein in units of watts per cubic centimeter (W/cm$^3$), which is the time averaged power density applied to the dopant cathode divided by the cathode-to-substrate distance. Decoupled, the range of power densities can be quantified as 1-15 W/cm$^2$.

The conductive metal oxide thin films were grown on epitaxial-polished c-plane sapphire substrates bonded to a stainless steel puck using silver paint. The puck surface temperature was about 370° C. and monitored by a 1.6 μm pyrometer. The conductive metal oxide thin films were annealed at about 700° C. for 1 hour in flowing O$_2$ post-deposition to improve or optimize oxygen uptake and to refine crystal structure. CdO transport properties were characterized using a Hall measurement system. Crystal quality and lattice parameters were characterized by X-ray diffraction (XRD) in parallel beam geometry employing a double bounce hybrid monochrometer for the incidence beam optic and an approximately 0.18° parallel plate collimator. Film thickness values were determined by X-ray Reflectivity (XRR).

FIG. 4 is a graph illustrating carrier concentration $n_e$ and carrier mobility $\mu_e$ as a function of magnetron power density and cathode to substrate distance, observed from donor doping CdO thin films having a thickness of about 150 nm in accordance with embodiments described herein. In particular, the carrier concentration $n_e$ and carrier mobility $\mu_e$ as a function of yttrium (Y) addition was monitored. To do so, a set of CdO films were prepared where the Y-flux was increased systematically. FIG. 4 summarizes the carrier concentration $n_e$ and mobility $\mu_e$ trends collected for this series. As shown in FIG. 4, intrinsic CdO has a carrier concentration $n_e$ of about $1 \times 10^{19}$ cm$^{-3}$ and a mobility $\mu_e$ of about 250 cm$^2$/(V·s); carrier concentration $n_e$ increases monotonically with increasing Y-flux, up to a saturation value of about $3.5 \times 10^{20}$ cm$^{-3}$; and mobility $\mu_e$ increases to a plateau value of about 400 cm$^2$/(V·s) or more up to a carrier concentration $n_e$ of about $2.2 \times 10^{20}$ cm$^{-3}$, after which mobility $\mu_e$ falls rapidly as additional yttrium is added.

The conductivity of intrinsic or undoped CdO can be attributed to its intrinsic n-type behavior, where sub-stoichiometric oxygen content may promote oxygen vacancy formation compensated by electrons. The high carrier concentrations (electrons for n-type CdO) at room temperature can be attributed to the shallow energy level of the electrons relative to the conduction band minimum. It has been shown that oxygen vacancies present in intrinsic CdO can act as doubly and singly ionized shallow donors, in contrast with other n-type transparent conducting oxides (TCOs).

The illustrated increases in carrier concentration $n_e$ with increasing Y content can be attributed to the following defect chemistry reaction for dissolution of Y in a CdO lattice:

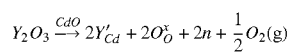

For Y-accommodation as a 3+ cation, its most stable state, each yttrium ion will be compensated by one electron. Between about $2 \times 10^{19}$ cm-3 and about $2 \times 10^{20}$ cm$^{-3}$, the increase in carrier concentration $n_e$ is substantially linear, with power density/working distance suggesting a substantially constant activation rate. As shown in FIG. 4, carrier concentration $n_e$ is essentially flat for very low Y content, while in the same range electron mobility $\mu_e$ increases sharply. For Dy-doped CdO (CdO:Dy), it has been demonstrated that adding aliovalent donors can reduce the concentration of oxygen vacancies promoted by a Fermi level shift to larger values, which in turn can increase the energetic expense of oxygen vacancy compensation and thus formation. The initial plateau in electron mobility $\mu_e$ in FIG. 4 may correspond to a region where carriers introduced by Y are effectively balanced by a reduction of carriers that compensate oxygen vacancies. In this same doping region (where the carrier concentration $n_e$ is between about $2 \times 10^{19}$ cm-3 and about $2 \times 10^{20}$ cm$^{-3}$), there is a large increase in electron mobility $\mu_e$. As for the case of CdO:Dy, this trend can be explained by a reduced population of oxygen vacancy donors and replacement by Y3+ donors. Since charged impurity scattering scales with $Z^2$, less impact may be expected from 2N donors with a 1+ charge with respect to the lattice, i.e., $Y_{Dy}\bullet$, than from N donors with a 2+ charge with respect to the lattice, i.e. Vo$\bullet\bullet$.

From carrier densities $n_e$ between about $2.5 \times 10^{19}$ and about $2.1 \times 10^{20}$, mobility values $\mu_e$ are greater than about 400 cm$^2$/(V·s), with a small reduction towards the high end of this range. Above carrier densities $n_e$ of about $2.1 \times 10^{20}$, the rate of free carrier generation per W/cm$^3$ is reduced, and there is a steep drop in mobility $\mu_e$. Such strong carrier-carrier scattering may be unexpected in this carrier density range (i.e., above carrier densities $n_e$ of about $2.1 \times 10^{20}$), and it may be unlikely that the curvature of the band structure changes so abruptly as to increase the effective mass. As such, an alternative mechanism may be present. For example, a change in film structure that accompanies this dopant range may promote additional scattering. To test this possibility, a four-circle x-ray diffraction analysis was conducted to identify trends in crystallinity as a function of doping level.

FIGS. 5A-5B are graphs illustrating x-ray diffraction data for a subset of CdO:Y thin films in accordance with embodiments described herein as a function of carrier concentration $n_e$. For epitaxial growth of CdO films on c-plane sapphire, crystallographic registry may occur when the (001) plane of CdO is tilted by 23.5 to sapphire (00.1) with a tilt direction parallel to sapphire <10.0>. This high-index orientation corresponds to a (025) CdO plane parallel to the sapphire basal plane. Based on the sapphire symmetry, there may be three equivalent in-plane orientations of CdO grains. Because of this tilted growth, CdO reflections may be visible only to asymmetric or skew-symmetric scans. FIG. 5A illustrates a series of asymmetric theta-two theta (0-20) scans surrounding the (220) plane CdO reflections as a function of yttrium doping. The (220) peak is chosen for its high relative intensity and because it can be accessed using an asymmetric configuration. As shown in FIG. 5A, the (220) plane interplanar spacing agrees with the bulk value; and its height and width are affected negligibly by the yttrium content, until the very highest Y concentrations. Full width half-maximum (FWHM) values are given with each pattern. Theta-two theta patterns of the (220) plane CdO reflection thus show consistently narrow peak widths.

A companion sub-set of omega scans for the same CdO:Y thin films in accordance with embodiments described herein are illustrated in FIG. 5B for the (220) plane reflections. As yttrium concentration increases, the omega scans of FIG. 5B show substantial broadening with the higher dopant density values. In particular, for carrier concentrations $n_e$ less than about $6.5 \times 10^{19}$ cm$^{-3}$, the omega scans indicate a relatively consistent FWHM value of about 0.30°. However, for carrier concentrations $n_e$ greater than about $6.5 \times 10^{19}$ cm$^{-3}$, the values broaden modestly until the very highest concentrations, where mosaicity increases sharply. The increase in mosaicity accompanies the drop in carrier mobility $\mu_e$ shown in FIG. 4 (that is, for carrier concentrations $n_e$ greater than about $2.2 \times 10^{20}$ cm$^{-3}$). This drop in carrier mobility $\mu_e$ may be attributed to electron scattering with an increasing population of crystallographic defects, such as low angle grain boundaries, that may be associated the onset of Y insolubility. Substantial asymmetry accompanies this broadening, which may indicate a preferred orientation for the mosaic substructure.

Figure 6:
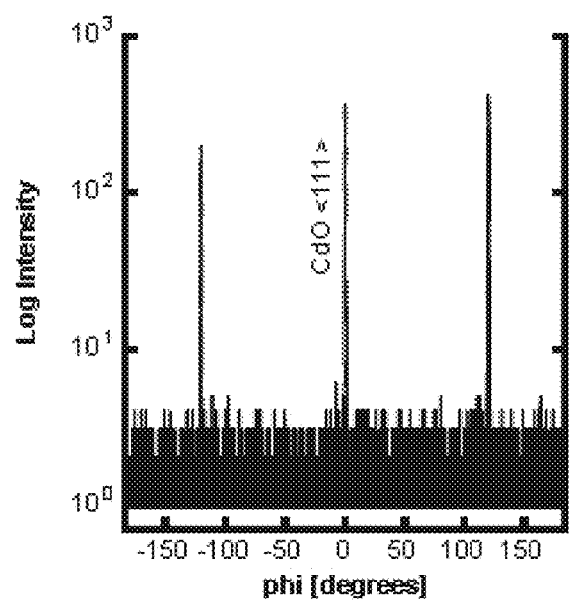
FIG. 6 is a graph illustrating a phi scan of CdO:Y thin films in accordance with some embodiments described herein.

FIG. 6 is a graph illustrating a (111) phi scan of CdO:Y thin films with intermediate carrier concentrations of about $6.1 \times 10^{19}$ cm$^{-3}$ in accordance with embodiments described herein. CdO adopts an in-plane alignment [100] CdO∥[01.0], which produces three individual CdO orientations related by 120°, each exhibiting 1-fold rotational symmetry with respect to the substrate normal. That is, the phi scan of <111> CdO planes in FIG. 6 indicate the presence of three equivalent in-plane orientations. The found epitaxial registry and the demonstrated full width half maxima in phi confirm the high crystallinity epitaxial growth mode of the CdO.

Figures 7A, 7B:
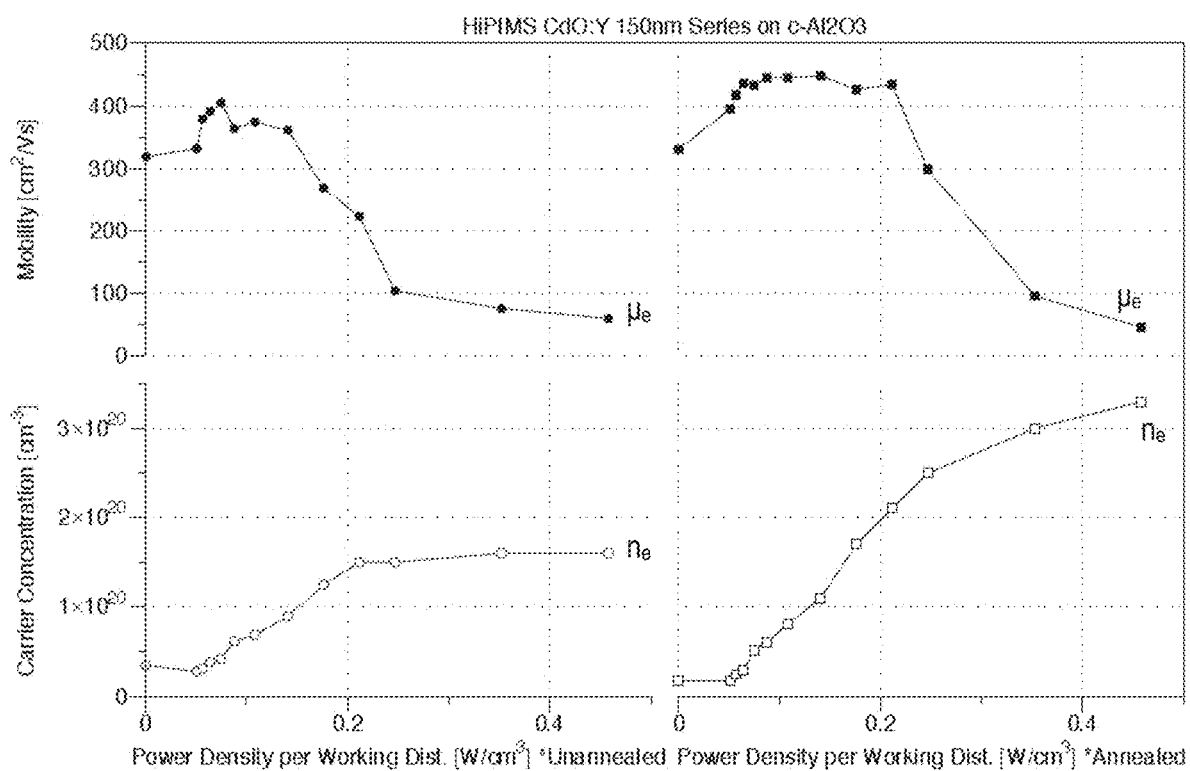
FIGS. 7A-7B are graphs illustrating characteristics of a 150 nm thick CdO:Y film formed using a deposition process in accordance with some embodiments described herein on a c-plane sapphire substrate.
Figures 10A, 10B:
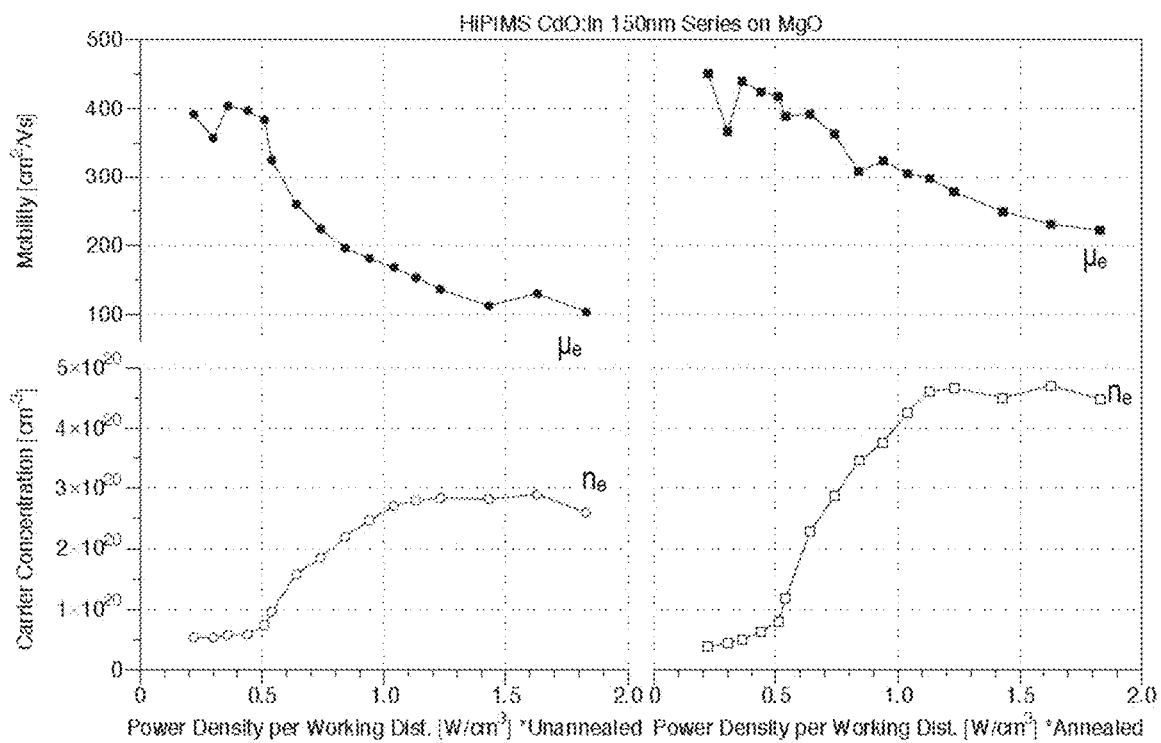
FIGS. 10A-10B are graphs illustrating characteristics of a 150 nm thick CdO:In film formed using a deposition process in accordance with some embodiments described herein on a magnesium oxide (MgO) substrate.
Figures 11A, 11B:
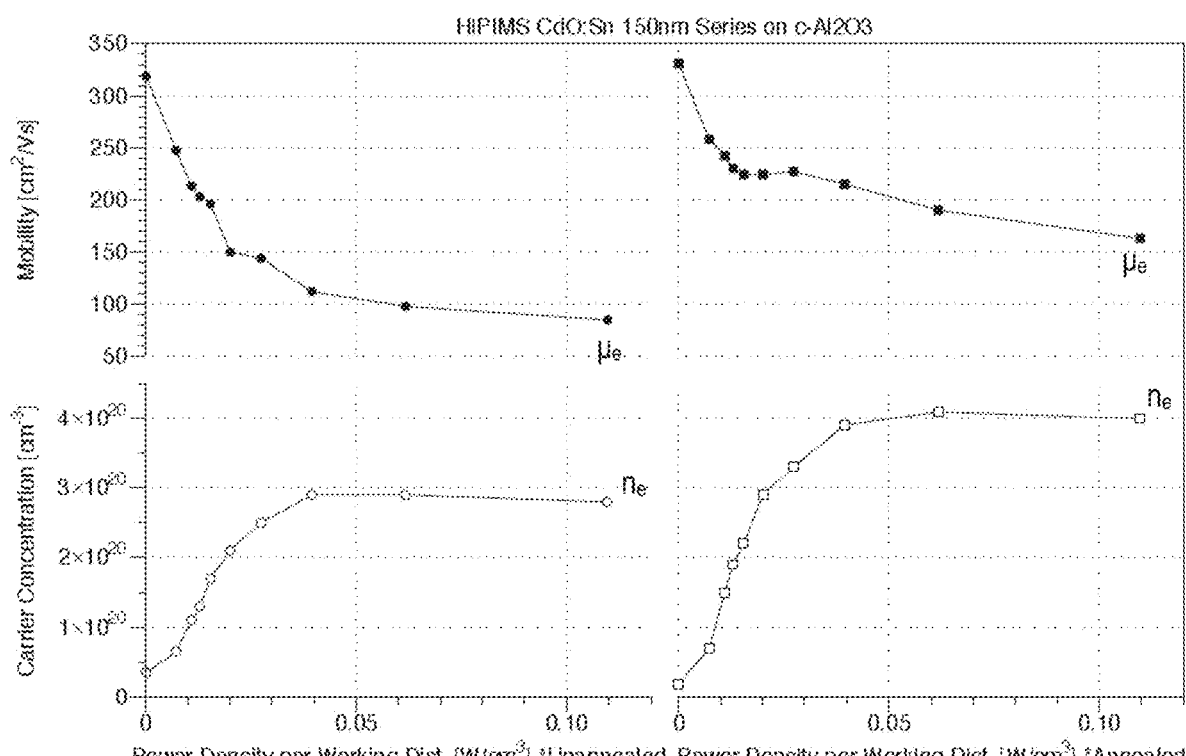
FIGS. 11A-11B are graphs illustrating characteristics of a 150 nm thick CdO:Sn film formed using a deposition process in accordance with some embodiments described herein on a c-plane sapphire substrate.
Figures 14A, 14B:
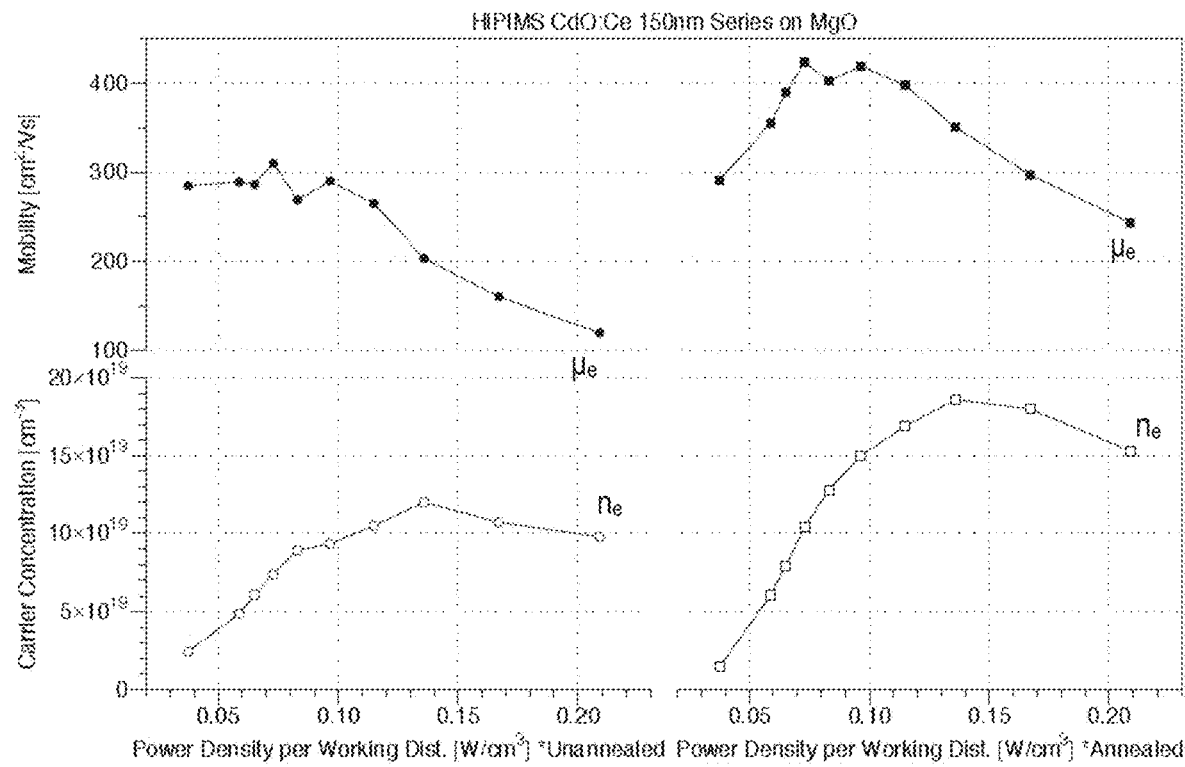
FIGS. 14A-14B are graphs illustrating characteristics of a 150 nm thick CdO:Ce film formed using a deposition process in accordance with some embodiments described herein on an MgO substrate.

FIGS. 7A-7B are graphs illustrating effects of a post-deposition anneal (such as described with reference to block 330 of FIG. 3) on characteristics of a 150 nm thick CdO:Y film formed using a HiPIMS-based deposition process on a c-plane sapphire substrate in accordance with embodiments described herein. As shown in FIGS. 7A-7B, both carrier concentration ne and carrier mobility µe were increased with increasing Y-flux in the annealed CdO:Y film of FIG. 7B, as compared to the unannealed CdO:Y film of FIG. 7A.

Yttrium-doped CdO (CdO:Y) thin films in accordance with embodiments described herein (such as the film 110 of FIG. 1) may thus be grown on c-plane sapphire (such as the substrate 115 of FIG. 1) via HiPIMS, and may exhibit characteristics similar to that of dysprosium doped CdO (CdO:Dy). Such conductive metal oxide thin films 110 maintain carrier mobility $\mu_e$ values in the range of up to about 400 cm$^2$/(V·s) over the dopant range $n_e$ $1.8 \times 10^{19}$ cm$^{-3}$ to $3.3 \times 10^{20}$ cm$^{-3}$. X-ray diffraction analysis for the conductive metal oxide thin films 110 reveals line widths in two-theta that are uniformly narrow and calculated lattice constants that are close to the bulk value (a=4.695 Angstrom). Rocking curve analysis/omega scans, however, reveals substantial broadening for carrier concentrations $n_e$ above about $2.5 \times 10^{20}$ cm$^{-3}$. A substantial drop in carrier mobility $\mu_e$ accompanies this pronounced mosaicity. The free carrier scattering induced by this increasing orientational disorder may be related to the observed reduced electronic transport. Accordingly, while conventional MBE-grown conductive metal oxides (such as CdO:Dy) may be useful in a variety of applications (for example, in the mid-infrared (IR) spectrum), embodiments described herein demonstrate that comparable transport properties can be achieved in sputtered conductive metal oxide thin films (such as CdO thin films with Y donors) formed in accordance with fabrication techniques described herein.

Although described primarily herein with reference to yttrium (Y) as a dopant for cadmium oxide thin films, it will be understood that other metals and dopants may be used to form conductive metal oxide thin films in accordance with embodiments described herein. As mentioned above, the doping element may be selected to result in deposition of a conductive metal oxide having one or more desired properties. In particular, while yttrium (Y) may be selected as a doping element to produce an increased or maximum carrier mobility $\mu_e$ at a given carrier concentration in a CdO film in some embodiments, indium (In) may be selected as a doping element in order to produce an increased or maximum achievable carrier concentration $n_e$ in the CdO film.

FIGS. 8A-8B are graphs illustrating characteristics of a 150 nm thick CdO:In film formed using a HiPIMS-based deposition process on a c-plane sapphire substrate in accordance with embodiments described herein, including effects of a post-deposition anneal (such as described with reference to block 330 of FIG. 3). As shown in FIGS. 8A-8B, both carrier concentration ne and carrier mobility $\mu_e$ were increased with increasing In-flux in the annealed CdO:In film of FIG. 8B, as compared to the unannealed CdO:In film of FIG. 8A. Also, by selecting indium (In) as the doping element, greater carrier concentrations in the CdO film were achieved (e.g., up to about $3.5 \times 10^{20}$ cm$^{-3}$ before anneal, and up to about $5 \times 10^{20}$ cm$^{-3}$ after anneal) as compared to the carrier concentrations in the CdO:Y film of FIGS. 7A-7B. FIGS. 9A-9B and 10A-10B illustrate similar effects for a 150 nm thick CdO:In film formed using a HiPIMS-based deposition process on r-plane sapphire and on magnesium oxide (MgO) substrates, respectively (e.g., increased or maximum carrier concentration $n_e$ due to use of In as the doping element, as well as further increase in carrier concentration $n_e$ and mobility $\mu_e$ due to the anneal), as compared to the carrier concentrations in the CdO:Y film of FIGS. 7A-7B.

FIGS. 11A-11B and 12A-12B are graphs illustrating characteristics of a 150 nm thick CdO:Sn film formed using a HiPIMS-based deposition process on c-plane sapphire and on MgO substrates, respectively, in accordance with embodiments described herein, including effects of a post-deposition anneal (such as described with reference to block 330 of FIG. 3). As shown in FIGS. 11A-11B and 12A-12B, both carrier concentration $n_e$ and carrier mobility $\mu_e$ were significantly increased with increasing Sn-flux in the annealed CdO:Sn films of FIGS. 11B and 12B, as compared to the unannealed CdO:Sn films of FIGS. 11A and 12A. By selecting tin (Sn) as the doping element, greater carrier concentrations but reduced carrier mobilities were achieved as compared to the CdO:Y film of FIGS. 7A-7B. Also, the carrier mobility $\mu_e$ of the CdO:Sn films of FIGS. 11A-11B and 12A-12B were more uniform (after an initial decrease) with increasing flux as compared to the CdO:Y film of FIGS. 7A-7B.

FIGS. 13A-13B and 14A-14B are graphs illustrating characteristics of a 150 nm thick CdO:Ce film formed using a HiPIMS-based deposition process on c-plane sapphire and on MgO substrates, respectively, in accordance with embodiments described herein, including effects of a post-deposition anneal (such as described with reference to block 330 of FIG. 3). As shown in FIGS. 13A-13B and 14A-14B, both carrier concentration $n_e$ and carrier mobility $\mu_e$ were increased with increasing Ce-flux in the annealed CdO:Ce films of FIGS. 13B and 14B, as compared to the unannealed CdO:Ce films of FIGS. 13A and 14A. By selecting cerium (Ce) as the doping element, greater carrier concentrations but reduced carrier mobilities were achieved as compared to the CdO:Y film of FIGS. 7A-7B. Also, the carrier mobility $\mu_e$ of the CdO:Ce films of FIGS. 11A-11B and 12A-12B decreased more gradually with increasing flux as compared to the CdO:Y film of FIGS. 7A-7B.

Figures 15A, 15B:
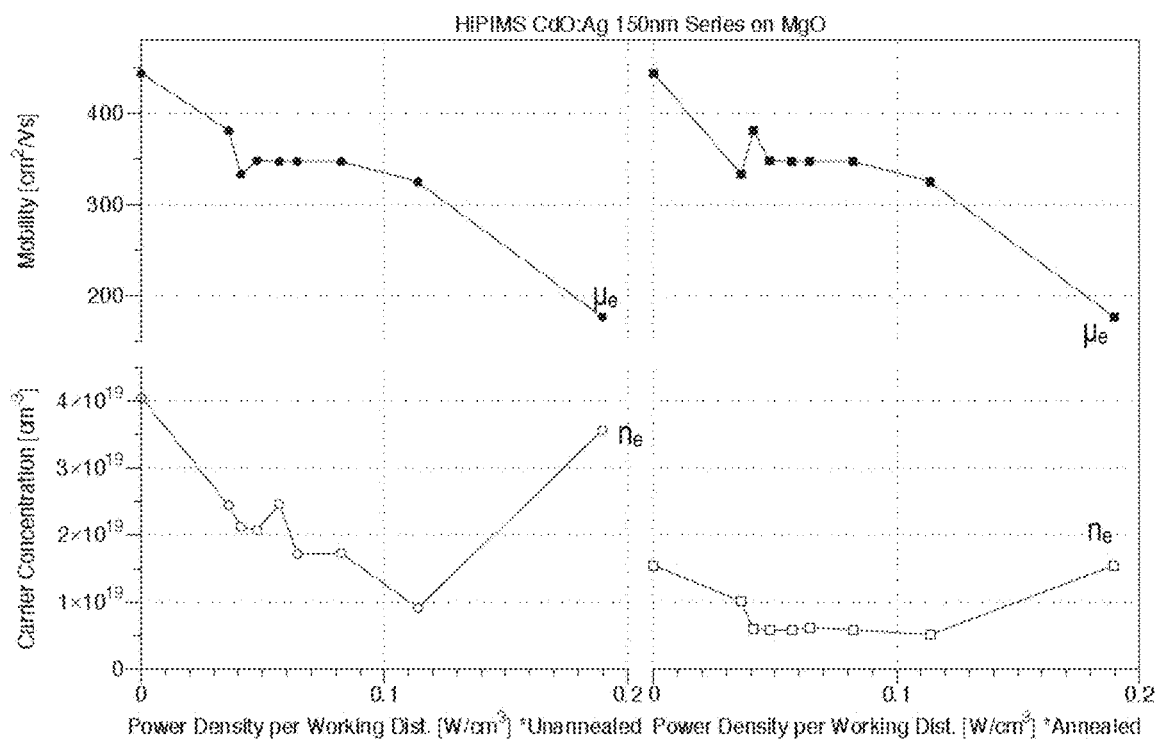
FIGS. 15A-15B are graphs illustrating characteristics of a 150 nm thick CdO:Ag film formed using a deposition process in accordance with some embodiments described herein on an MgO substrate.

FIGS. 15A-15B are graphs illustrating characteristics of a 150 nm thick CdO:Ag film formed using a HiPIMS-based deposition process on a MgO substrate in accordance with embodiments described herein, including effects of a post-deposition anneal (such as described with reference to block 330 of FIG. 3). As shown in FIGS. 15A-15B, in contrast with other dopant elements described above, neither carrier concentration $n_e$ nor carrier mobility $\mu_e$ were increased in the annealed CdO:Ag film of FIG. 15B, as compared to the unannealed CdO:Ag film of FIG. 15A. To the contrary, by using silver (Ag) as the doping element, carrier concentration $n_e$ was substantially reduced by the anneal, while carrier mobility $\mu_e$ was substantially unchanged. Thus, the graphs of FIGS. 7-15 illustrate that the selection of the doping element can be used to significantly affect characteristics of conductive metal oxides fabricated in accordance with techniques described herein.

Figure 16:
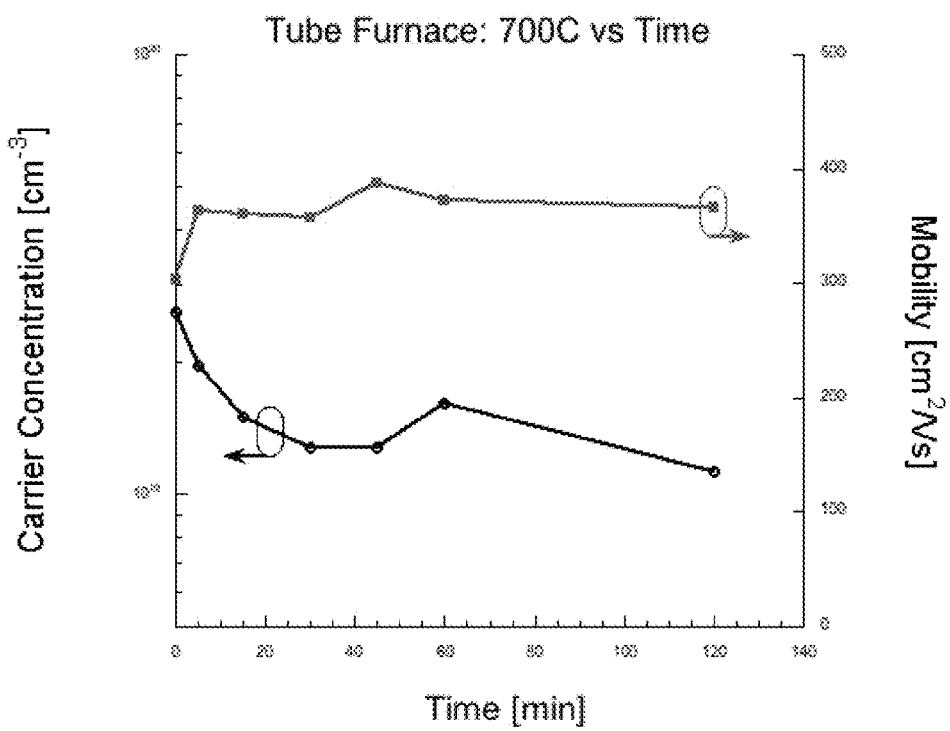
FIG. 16 is a graph illustrating effects of a post-deposition anneal on carrier concentration and carrier mobility of a CdO film formed using deposition processes in accordance with some embodiments described herein as a function of time.

FIG. 16 is a graph of experimental data illustrating effects of a post-deposition anneal in accordance with embodiments described herein (such as described with reference to block 330 of FIG. 3) as a function of the duration of the post-deposition anneal. In particular, FIG. 16 illustrates the time dependence of carrier concentration and carrier mobility of a CdO film formed using a HiPIMS-based deposition process in accordance with embodiments described herein responsive to a 700 degrees C. post-deposition anneal over a duration of 120 minutes. As shown in FIG. 16, carrier mobility increased (compared to the as-deposited CdO film) due to the post-deposition anneal, while carrier concentration decreased. A post-deposition anneal duration of between about 30 minutes to about 60 minutes may provide the optimum effect on both carrier concentration and carrier mobility.

Figure 17:
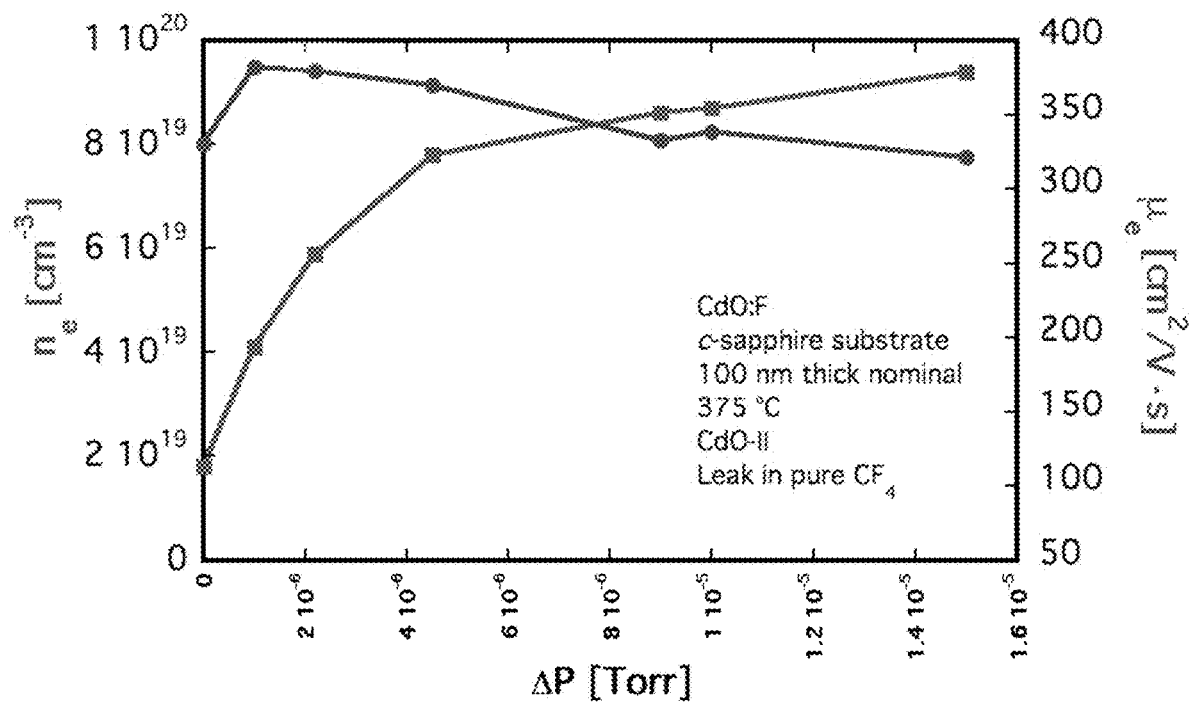
FIG. 17 is a graph illustrating characteristics of a 100 nm thick CdO:F film formed using deposition processes in accordance with some embodiments described herein on a c-plane sapphire substrate.
Figures 18A, 18B:
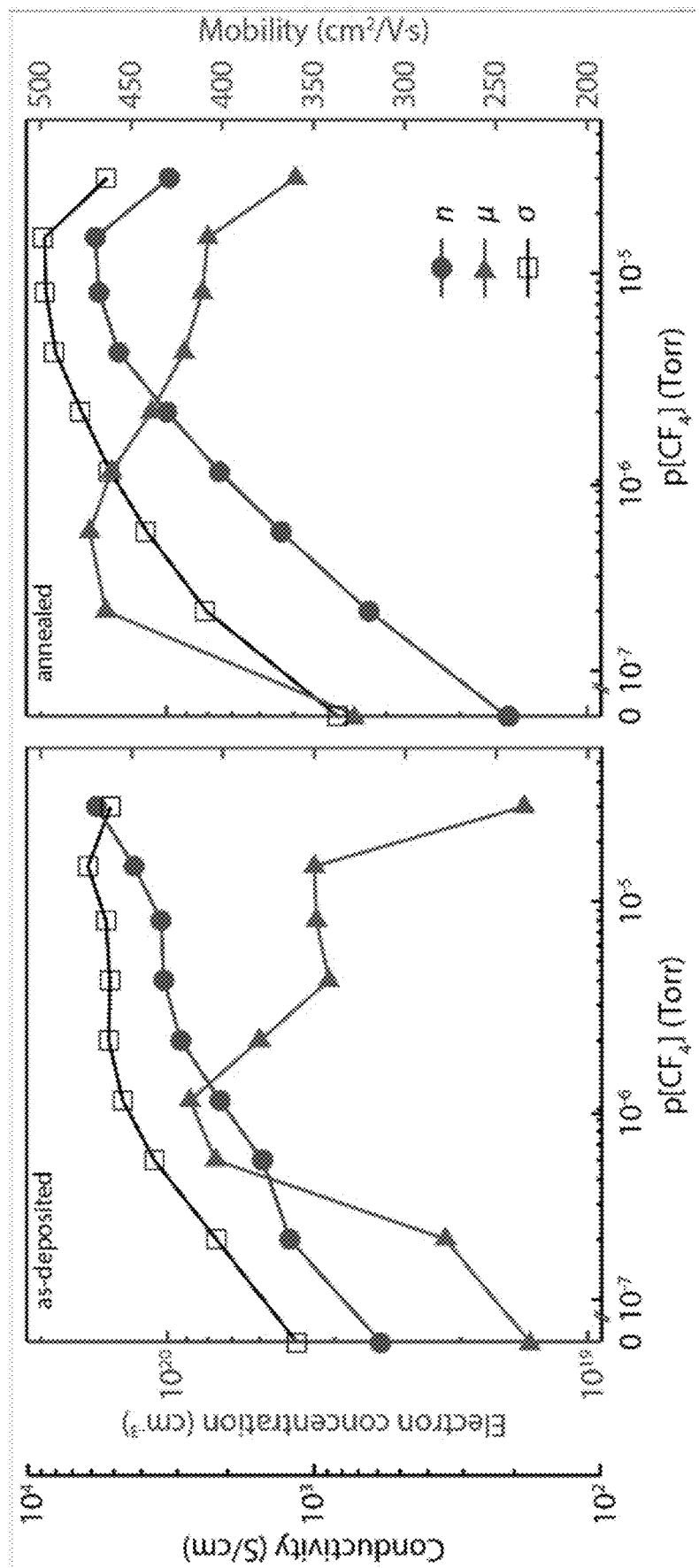
FIGS. 18A and 18B are graphs illustrating characteristics of CdO:F films as-deposited and after annealing, respectively, formed using deposition processes in accordance with some embodiments described herein on a r-plane sapphire substrate.

While described primarily herein with reference to solid-phase doping sources, embodiments of the present disclosure may also utilize a gaseous phase halogenated organic or metal-organic doping source. FIGS. 17 and 18A-18B are graphs illustrating carrier concentration and carrier mobility of CdO:F films formed using a $CF_4$ gas as a doping source.

In particular, FIG. 17 illustrates effects of changes in pressure ΔP of the doping source on characteristics of a 100 nm thick CdO:F film formed using a HiPIMS-based deposition process in accordance with some embodiments described herein on a c-plane sapphire substrate. As shown in FIG. 17, carrier concentration $n_e$ of the CdO:F film generally increased with increased change in pressure ΔP of the $CF_4$ gas, while carrier mobility $\mu_e$ of the CdO:F film generally decreased with increased change in pressure ΔP of the $CF_4$ gas.

In addition, FIGS. 18A and 18B illustrate effects of the pressure P of the doping source on characteristics of 120 to 160 nm thick CdO:F films formed using a HiPIMS-based deposition process in accordance with some embodiments described herein on an r-plane sapphire substrate. Carrier (here, electron) concentration $n_e$ (filled circles), mobility $\mu_e$ (filled triangles), and conductivity σ (empty squares) are plotted as a function of $CF_4$ background pressure in the deposition chamber. In particular, FIG. 18A illustrates effects of the pressure P of the $CF_4$ gaseous doping source on conductivity σ, carrier concentration $n_e$, and carrier mobility $\mu_e$ of the CdO:F film as-deposited, while FIG. 18B illustrates effects of the pressure P of the $CF_4$ gaseous doping source on conductivity σ, carrier concentration $n_e$, and carrier mobility $\mu_e$ of the CdO:F film responsive to a post-deposition anneal (such as described with reference to block 330 of FIG. 3). As shown in FIGS. 18A and 18B, conductivity σ and carrier concentration $n_e$ generally increased with increasing pressure P of the $CF_4$ gas, both in the as-deposited film and the annealed film, with the annealed film exhibiting lower initial but higher peak conductivity σ and carrier concentration $n_e$ as compared with the as-deposited film. Carrier mobility $\mu_e$ initially increased at lower pressures P of the $CF_4$ gas, but then decreased as pressure P of the $CF_4$ gas increased, both in the as-deposited film and the annealed film. However, a significant increase in carrier mobility $\mu_e$ resulted in response to the post-deposition anneal, which was conducted under static $O_2$ gas at 1 atm and 700° C. for 1 hour.

Further embodiments are described in detail below with reference to simulated and experimental data for CdO:F films formed using a $CF_4$ gas as a doping source in accordance with embodiments of the present disclosure. It is to be understood that this data and the accompanying description is provided by way of example only, to illustrate characteristics of some embodiments described herein.

In some embodiments, fluorine-doped CdO may be an example infrared plasmonic material by virtue of its tunable carrier density, high mobility, and intense extreme-subwavelength plasmon-polariton coupling. Carrier concentrations ranging from $10^{19}$ to $10^{20}$ cm$^{-3}$, with electron mobility values as high as 473 cm$^2$/V·s, may be achieved in epitaxial CdO films over a thickness range spanning 50 to 500 nm. Carrier concentration may be achieved by reactive sputtering in an Ar/$O_2$ atmosphere with trace quantities of $CF_4$. Infrared reflectometry measurements demonstrate the possibility of near-perfect plasmonic absorption through up to the entire mid-IR spectral range. A companion set of reflectivity simulations may be used to predict, understand, and/or improve/optimize the epsilon-near-zero plasmonic modes. In the context of other transparent conductors, CdO exhibits substantially higher electron mobility values, and thus sharp and tunable absorption features. This highlights the some advantages of high-mobility TCOs as a materials system for supporting strong, designed light-matter interaction.

Due to interest in light-matter interaction at infrared (IR) energies, transparent conducting oxides (TCOs) may command considerable attention from the photonics and plasmonics communities. As a class of plasmonic materials, TCOs can offer boutique optical properties and absorption by design throughout the near- and mid-IR. By virtue of accessible electron concentrations ranging from $10^{18}$ to $10^{21}$ cm$^{-3}$, TCOs intrinsically interact with IR light and can be tuned to resonate with specific IR energies by doping. By contrast, some traditional plasmonic materials, like metals, have fixed electron concentrations and thus may require sophisticated nanofabrication techniques to engineer IR light interactions. The ability to tune IR optical properties in TCOs can enable advanced optical materials and devices operating at telecommunications and biologically relevant wavelengths.

Additionally, some TCOs can provide high electron mobility, particularly when defect chemistry is tightly controlled in high quality crystals. Electron mobility has a strong impact on plasmonic performance, and high mobilities correspond to stronger light-matter interaction, more effective light concentration, and sharp plasmonic resonances with high quality factors. In some instances, rocksalt cadmium oxide (CdO) may exhibit the highest electronic mobility amongst TCOs and the best plasmonic performance in the IR.

Dysprosium-doped CdO (Dy:CdO), grown by molecular beam epitaxy (MBE), can achieve mobilities reaching 500 cm$^2$/V·s and tunable carrier concentrations between $10^{19}$ and $10^{21}$ cm$^{-3}$. Despite the plasmonic performance of this material, MBE-grown Dy:CdO may have some significant practical disadvantages. For example, film growth by MBE can be slow and difficult to scale commercially, and Dy is an expensive and reactive element. Given the promise of CdO as a plasmonic host, embodiments of the present disclosure provide alternative dopants and deposition methods to enhance the utility of this material. For example, reactive high-power impulse magnetron sputtering (HiPIMS) is a viable method for depositing Y-doped CdO films with electronic properties on par with films deposited by MBE. These films skirt the aforementioned disadvantages, as Y is more prevalent and more stable than Dy, and HiPIMS combines the deposition rates and scalability of magnetron sputtering while producing smooth and dense films comparable to those grown by MBE.

In addition, a number of aliovalent dopants that substitute Cd$^{2+}$ on the cation sublattice have been studied, including Dy, Y, In, Sc, Sn, V, and Ti. Rarely investigated, however, are aliovalent dopants that substitute O$^{2-}$ on the anion sublattice. Examining the crystal ionic radius of 6-coordinate O$^{2-}$ (1.26 pm), and considering anions that would act as donors at an oxygen site, reveals F (1.19 pm) as an appealing candidate in CdO. Fluorine-doped CdO (F:CdO) has been studied, but the electronic properties of some conventional F:CdO films may not be comparable to Dy:CdO. Furthermore, with the exception of colloidal F:CdO nanocrystals, there may be little data as to the plasmonic properties of F:CdO thin films. By contrast, fluorine is a viable and well studied dopant in tin oxide (SnO$_2$). Some embodiments described herein are thus directed to substitutional, aliovalent anion doping with fluorine as a strategy for producing plasmonic CdO films with tunable carrier concentration and high electron mobility.

Fluorine may be a promising dopant for a few reasons. First, given the F$^-$/O$^{2-}$ ionic radius match, only modest lattice strain associated with doping may be expected, which may reduce or minimize carrier scattering in the same or similar manner as Dy$^{3+}$ in CdO. Second, the CdO conduction and valence bands have primarily Cd 5s and O 2p/2s character, respectively. For F substituted on an O$^{2-}$ site, electronic structure perturbations may be expected primarily in the valence band, which may limit ionized impurity scattering in a manner analogous to modulation doping. This effect has been observed in SnO$_2$ by computational studies. Third, from the coupled intrinsic and extrinsic defect reactions (written in Kroger-Vink notation) of F-doped CdO:

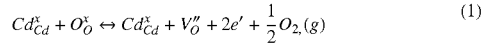  (1)

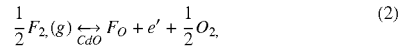  (2)

LeChatlier's principle can predict that F doping may drive the intrinsic defect equilibrium reaction (1) above towards the reactant side, suppressing the formation of oxygen vacancies. This behavior has been observed in Dy- and Y-doped CdO. Finally, F-doping presents the opportunity to use a gas phase precursor, such as (but not limited to) fluorine (F$_2$), sulfur hexafluoride (SF$_6$), or tetrafluoromethane (CF$_4$), in a reactive HiPIMS deposition. This may allow control over dopant concentration by changing the partial pressure of the dopant precursor gas, which can simplify the design and operation of the vacuum sputtering chamber, which may eliminate the need for multiple magnetrons or alloyed targets, and enable quick and in-line changes to film properties without breaking vacuum.

Some embodiments of the present disclosure are directed to the electronic, morphological, and plasmonic properties of F:CdO thin films deposited by HiPIMS. By using CF$_4$ as a fluorine source, CdO thin films may be fabricated with free carrier concentrations spanning an order of magnitude, from $10^{19}$ to $10^{20}$ cm$^{-3}$, with electron mobilities as high as 473 cm$^2$/V·s. These properties, combined with control over film thickness, can allow growth of F:CdO films that sustain epsilon-near-zero (ENZ) modes in addition to surface plasmon resonance. Some embodiments may provide ENZ modes spanning an energy range greater than 1800 cm$^{-1}$ (2700 nm) across the mid-IR, with peak widths as small 321 cm$^{-1}$, and peak extinction values as high as 97%. These results rival Dy:CdO and Y:CdO in performance, despite the fact that the films are deposited by sputtering and using an alternative dopant. This underscores the performance and versatility of CdO as a plasmonic host.

Particular embodiments described in detail below grow F:CdO thin films on r-plane (012) single crystal sapphire substrates using reactive HiPIMS from a 99.9999% pure metallic Cd target. The sputtering environment is a mixture of argon, oxygen, and CF$_4$, with a 6:4 ratio of Ar:O$_2$ by pressure and a total sputtering pressure of 10 mTorr. The fluorine content of the sputtered F:CdO films is controlled by adjusting the background pressure of CF$_4$ using a leak valve and ion gauge.

Figure 19A:
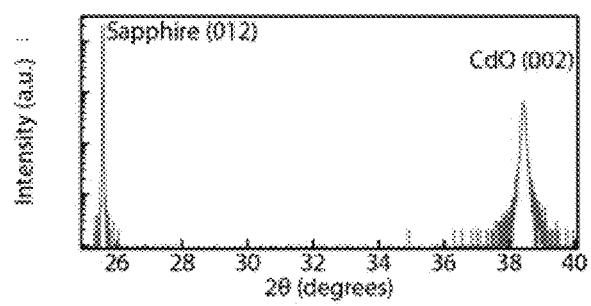
FIG. 19A is a graph illustrating a 2θ-ω XRD scan of heteroepitaxial CdO:F film in accordance with some embodiments described herein on an r-plane sapphire substrate.
Figure 19B:
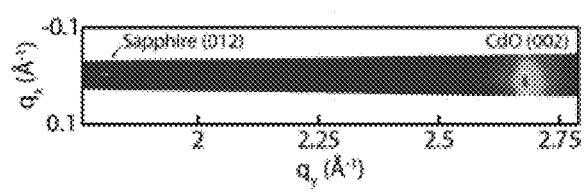
FIG. 19B is a 2D reciprocal space map showing an epitaxial relationship between CdO and r-plane sapphire.
Figure 19C:
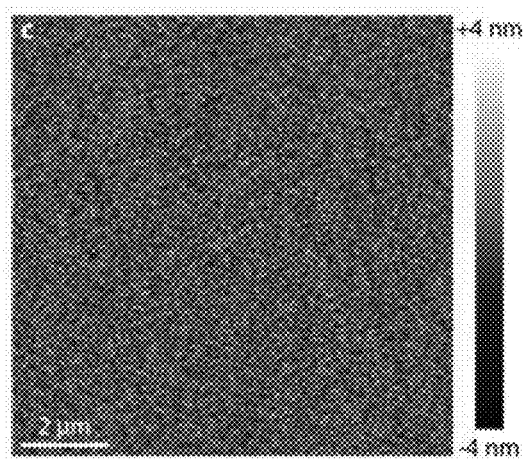
FIG. 19C is an atomic force microscopy (AFM) scan of an as-grown CdO:F film in accordance with some embodiments described herein.

Structural and morphological characterization of F:CdO thin films are illustrated in FIGS. 19A-19C. In particular, FIG. 19A illustrates a 2θ-ω XRD scan of heteroepitaxial CdO, with a (001) growth habit, on r-plane sapphire, FIG. 19B illustrates a 2D reciprocal space map showing an epitaxial relationship between CdO and r-plane sapphire, and FIG. 19C illustrates an AFM scan of an as-grown F:CdO film with a RMS roughness of 858 pm.

X-ray diffraction (XRD) shows that F:CdO grows epitaxially on r-plane sapphire along the [001] direction, as the symmetric 2θ-ω scans and reciprocal space maps of FIGS. 19A and 19B show only substrate and CdO (002) peaks. Peak positions shift to slightly higher 2θ values at high dopant concentrations, suggesting a slight lattice contraction in F:CdO thin films according to some embodiments of the present disclosure, which could be due the slightly smaller ionic radius of F$^-$ compared to O$^{2-}$. Additionally, ω rocking curves about the CdO (002) peak and φ scans about the CdO (111) peak confirm epitaxial growth with peak widths of 0.15° and 0.20° in ω and φ, respectively. Such XRD data indicates that fluorine can be a substitutional dopant on the oxygen sublattice and may not perturb epitaxial quality.

In addition to their crystalline quality, F:CdO films according to some embodiments of the present disclosure can be uniform and smooth as characterized with atomic force microscopy, as shown in FIG. 19C. As-grown, F:CdO films can have a root-mean-square (RMS) roughness on the order of 800-1000 pm, which can be beneficial for reducing electron scattering at the film surface and for maintaining high electron mobility and limiting plasmon damping at the low film thicknesses required for supporting ENZ modes.

The electronic properties of F:CdO films according to some embodiments of the present disclosure were characterized using Hall effect measurements to determine carrier concentration, mobility, and conductivity as a function of fluorine content, as shown in FIG. 18A. By varying the pressure of CF$_4$ present during sputtering, carrier concentrations in the as-grown films according to some embodiments of the present disclosure can range from about 3×10$^{19}$ cm$^{-3}$ for intrinsic/unintentionally doped (UID) CdO up to about 1.6×10$^{20}$ cm$^{-3}$ for F:CdO. Increasing the CF$_4$ pressure beyond this range may result in rough and non-uniform films without an increase in carrier concentration, presumably as a result of resputtering or etching by reactive fluorine ion species. Within this composition range, carrier concentration increases monotonically with a logarithmic dependence on CF$_4$ pressure, indicating that the presence of CF$_4$ gas in a reactive sputtering environment may generate free carriers.

In FIGS. 18A-18B, electronic properties including electron concentration n$_e$ (filled circles), mobility μ$_e$ (filled triangles), and conductivity σ (empty squares) of F:CdO thin films according to some embodiments of the present disclosure are plotted as a function of CF$_4$ background pressure in the deposition chamber. FIG. 18A illustrates these electronic properties of the CdO:F film as-deposited, while FIG. 18B illustrates these electronic properties after annealing under static O$_2$ gas at 1 atm and 700° C. for 1 hour. As shown in FIGS. 18A-18B, coincident with carrier concentration increase, the electron mobility increases dramatically with the introduction of CF$_4$, reaching greater than about 400 cm$^2$/V·s at 7.5×10$^{19}$ e$^-$/cm$^3$ in the as-grown films. At higher CF$_4$ pressures, the mobility decreases gradually to about 350 cm$^2$/V·s before dropping more precipitously at the highest electron concentrations. The gradual drop may be due to ionized impurity scattering of electrons from F, and the stronger drop may be from reactive F$^-$ etching or resputtering during deposition, which can adversely affect film quality.

The high mobilities achieved in some embodiments of the present disclosure at elevated carrier concentrations may rule out oxygen vacancies as a primary electron source in F:CdO. Oxygen vacancies are doubly charged defects and scatter electrons four times as strongly as singly ionized defects, so it may not be possible for the mobility and carrier concentration to increase simultaneously above UID levels if oxygen vacancies are the primary donor defect. Rather, one explanation for the mobility increase may invoke LeChatlier's principle and the defect reactions shown in (1) and (2) above, to show that fluorine incorporation can enhance electron mobility by suppressing the formation of oxygen vacancies. Based on the carrier concentration and mobility trends, and the XRD results above, CF$_4$ may serve as a source of F, which may be acting as a substitutional donor dopant on the oxygen sublattice.

The effects of annealing in an oxygen-rich environment on the electronic properties of F:CdO were also investigated by heating the films to 700° C. in 1 atm of O$_2$ for one hour, the results of which are shown in FIG. 18B. Because the concentration of oxygen vacancies in defect reaction (1) is proportional to p(O$_2$)$^{-1/6}$, annealing in pure oxygen could reduce oxygen vacancy concentrations by a factor as high as 7.5 (e.g., 4 mTorr O$_2$ during deposition compared to 760 Torr during annealing), reducing ionized impurity scattering. Annealing may additionally heal other defects, such as dislocations and grain boundaries, to improve crystal quality and mobility. Indeed, the electron mobility was improved in multiple annealed samples, with a maximum mobility of about 473 cm$^2$/V·s at about 5.4×10$^{19}$ e$^-$/cm$^3$ in some embodiments. This is comparable to the peak mobility observed in Dy:CdO at approximately the same carrier concentration. Enhanced surface morphology was also observed by AFM in the annealed films, with RMS roughness decreasing to about 400-500 pm, and enhanced crystalline quality, as seen by a decrease in the rocking curve peak widths. Finally, annealing may decrease the carrier concentration in films with as-deposited carrier concentrations below about 7.5×10$^{19}$ cm$^{-3}$, further indicating that oxygen defects may be healed. Above about 7.5×10$^{19}$ cm$^{-3}$, annealing increases carrier concentration slightly, which may indicate that not all fluorine dopants are activated in the as-deposited films. Ultimately, some embodiments of the present disclosure may achieve conductivities of nearly 10,000 S/cm in annealed F:CdO films, a high value for TCOs.

The electronic properties achievable according to some embodiments of the present disclosure, and the degree to which these electronic properties can be controlled in accordance with some embodiments of the present disclosure, means that F:CdO films as described herein are amenable to supporting strong, weakly-damped plasmonic resonance in the infrared. The plasmonic properties of the films can be dictated by their frequency-dependent dielectric function, which, assuming that the films behave as Drude metals, is given by:

$$\varepsilon(\omega) = \partial_\infty - \frac{\omega_p^2}{\omega^2 + l\omega\Gamma} \quad (3)$$

where ε$_\infty$ is the high-frequency dielectric constant (4.9-5.5 for CdO), Γ is the damping rate (which is inversely proportional to mobility), and $\omega_p = \sqrt{ne^2/m^*\varepsilon_0}$ is the plasma frequency (which is proportional to the square root of electron concentration). The carrier concentrations achievable in some embodiments correspond to plasma frequencies in the near-IR, which can lead to surface plasmon and ENZ modes in the near- to mid-IR. F:CdO films according to some embodiments to support an ENZ mode when the following relation is satisfied:

$$1 + \frac{\varepsilon_1 k_{z3}}{\varepsilon_0 k_{z1}} = j\tan(k_{z2}d)\left(\frac{\varepsilon_2 k_{z3}}{\varepsilon_1 k_{z2}} + \frac{\varepsilon_1 k_{z2}}{\varepsilon_2 k_{z1}}\right) \quad (4)$$

where d is film thickness $$k_{zi}^2(\omega) = \varepsilon_i \frac{\omega^2}{a^3} - k_\parallel^2$$

is the square of the longitudinal (i.e., perpendicular to the film surface in the z direction) wavenumber in layer i (1=free space, 2=F:CdO, 3=sapphire), ε$_i$ is the relative permittivity of layer i, and k$_\parallel$ is the transverse (i.e. parallel to the film surface) wavenumber, with Re(k$_{z,i}$)+Im(k$_{z,i}$)≥0.

Equation (4) above results from solving Maxwell's equations in the absence of external excitations for thin film systems in accordance with embodiments of the present disclosure, and the (k$_\parallel$, w) pair that satisfies the equation defines the ENZ mode of the system. The ENZ mode can be considered to be the long-range surface plasmon in the limit of very thin films well below the optical skin depth of the plasmonic material (ranging from 433 nm to 6 μm for F:CdO thin films as described herein across the mid-IR), with a resonant energy that is approximately equal to the zero point of the dielectric function, given by:

$$\omega_{ENZ} = \sqrt{\frac{\omega_p^2}{\varepsilon_\infty} - \Gamma^2} \quad (5)$$

Some additional characteristics of ENZ modes include that they can be minimally dispersive, meaning that their energies are weakly dependent on incident angle (i.e. increasing $k_\parallel$), they can require film thicknesses $$d \ll \frac{\lambda_p}{\varepsilon\pi},$$

where $\lambda_p$ is the wavelength of the plasma frequency, and that the z-component of the electric field can be nearly entirely confined within the film. As such, plasmonic films tailored to support ENZ modes can confine light more strongly and generate stronger electric fields. Such films can be used in applications such as perfect or near-perfect light absorption over multiple incident angles.

Based on the Drude model and Fresnel's reflection coefficients, ENZ modes can be simulated in doped CdO, and the thicknesses and carrier concentrations needed for near-perfect absorption can be determined. After growing CdO films in accordance with some embodiments of the present disclosure, their optical spectra can be measured using IR variable angle spectroscopic ellipsometry (IR-VASE) in the Kretschmann configuration, and the reflectivity can be plotted as the ratio of reflected p-polarized light to reflected s-polarized light, as shown in the graphs of FIGS. 20A-20D.

Figures 20C, 20D:
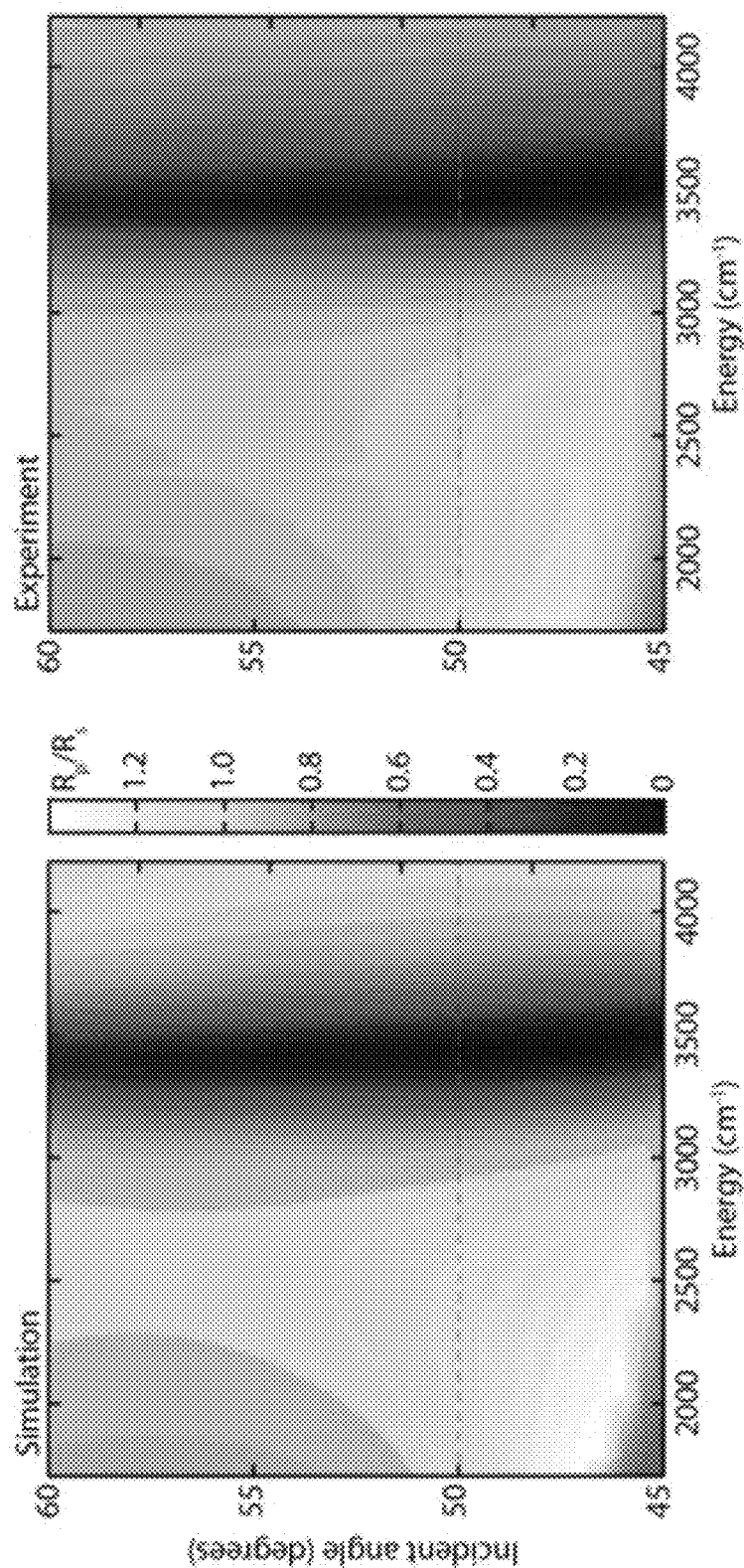
FIGS. 20C and 20D are graphs illustrating simulated and experimental mid-IR reflectivity maps, respectively, for a sample CdO:F film in accordance with some embodiments described herein.

In particular, FIG. 20A illustrates simulated and experimentally measured reflectivity curves for a F:CdO film according to some embodiments of the present disclosure (corresponding to sample f in Table 1, below), while FIG. 20B illustrates experimental reflectivity curves for several F:CdO films with varying carrier concentration according to some embodiments of the present disclosure. For ease of visual comparison, the data are normalized to the reflectivity minima and flat film reflectivity at 5000-6000 $cm^{-1}$. The letters beneath each curve in FIG. 20B correspond to the sample IDs listed in Table 1, which shows the electronic and optical properties of each sample. FIG. 20C illustrates a simulated mid-IR reflectivity map for sample f in Table 1, while FIG. 20D illustrates experimental mid-IR reflectivity map for sample f in Table 1. The dashed horizontal line cuts in the reflectivity maps of FIGS. 20C and 20D correspond to the simulated and experimental curves shown in FIG. 20A.

As shown in FIG. 20A, simulation provides a prediction of the ENZ mode of a 74 nm thick F:CdO film with a carrier concentration of $1.5 \times 10^{19}$ $cm^{-3}$ and a mobility of 248 $cm^2/V \cdot s$, including a reflection minimum that represents coupling 97% p-polarized light into the film's ENZ mode. Hereafter, this coupling may be simply referred to as absorption, for ease of explanation.

Using simulations as a guide, F:CdO thin films in accordance with some embodiments of the present disclosure having a range of different thicknesses were grown with physical properties targeted to sustain ENZ modes spanning the mid-IR range, as shown in FIG. 20B. The electronic and optical properties of these films, characterized by Hall effect measurements and IR-VASE, respectively, are summarized in Table 1. As opposed to the initial film series, these ENZ layers are thinner, which may be helpful or necessary to achieve perfect or near-perfect absorption. As such, the F:CdO thin films summarized in Table 1 may have surface area-to-volume ratios that are larger and mobilities that are somewhat lower; this effect has been observed in CdO, amongst other TCO and semiconductor systems. The ENZ films of Table 1 can absorb over 74% of incident p-polarized light at their resonance frequency, with the more-optimized films absorbing 90% to 97% of p-polarized light. Thanks to the high mobility of F:CdO thin films in accordance with some embodiments of the present disclosure, the absorption features are sharp, with peak widths as narrow as 321 $cm^{-1}$ (40 meV), giving quality factors (the ratio of peak energy to peak width) as high as 9.

TABLE 1

Thickness, electronic properties, and optical properties of the F:CdO films with ENZ features as shown in FIGS. 20A-20D.

| Sample ID | Thickness | Electron concentration ($10^{19}$ $cm^{-3}$) | Electron mobility ($cm^2/V \cdot s$) | Absolute peak extinction value | Extinction peak position | Extinction peak FWHM | Q |
|---|---|---|---|---|---|---|---|
| a | 161 nm | 3.1 | 232 | 0.74 | 1800 $cm^{-1}$ | 396 $cm^{-1}$ | 4.5 |
| b | 124 nm | 4.4 | 352 | 0.80 | 2151 $cm^{-1}$ | 383 $cm^{-1}$ | 5.6 |
| c | 93 nm | 6.6 | 384 | 0.91 | 2610 $cm^{-1}$ | 321 $cm^{-1}$ | 8.1 |
| d | 76 nm | 9.1 | 384 | 0.90 | 2934 $cm^{-1}$ | 351 $cm^{-1}$ | 8.4 |
| e | 47 nm | 11.3 | 317 | 0.76 | 3175 $cm^{-1}$ | 352 $cm^{-1}$ | 9.0 |
| f | 74 nm | 14.6 | 248 | 0.97 | 3486 $cm^{-1}$ | 483 $cm^{-1}$ | 7.2 |
| g | 57 nm | 15.7 | 193 | 0.79 | 3668 $cm^{-1}$ | 522 $cm^{-1}$ | 7.0 |

The angular dependence or dispersion of ENZ modes of F:CdO thin films in accordance with some embodiments of the present disclosure were also simulated and measured. FIG. 20C shows a simulated mid-IR reflectivity map of sample f (the same sample shown in FIG. 20A) over multiple incident angles. The dark band of minimum reflected intensity at about 3500 $cm^{-1}$ represents strong coupling of incident light into the ENZ mode. As expected for an ENZ mode, the absorption band exhibits very little dispersion, and its energy does not change significantly with incident angle. The experimental reflectivity map for sample f, as shown in FIG. 20D, collected using IR-VASE over multiple incident angles, matches our simulation quite well. The absorption band in this sample is non-dispersive, providing further evidence that the limiting case (with decreasing thickness) of an ENZ mode may be approached in this extreme sub-wavelength layer.

Figures 21A, 21B:
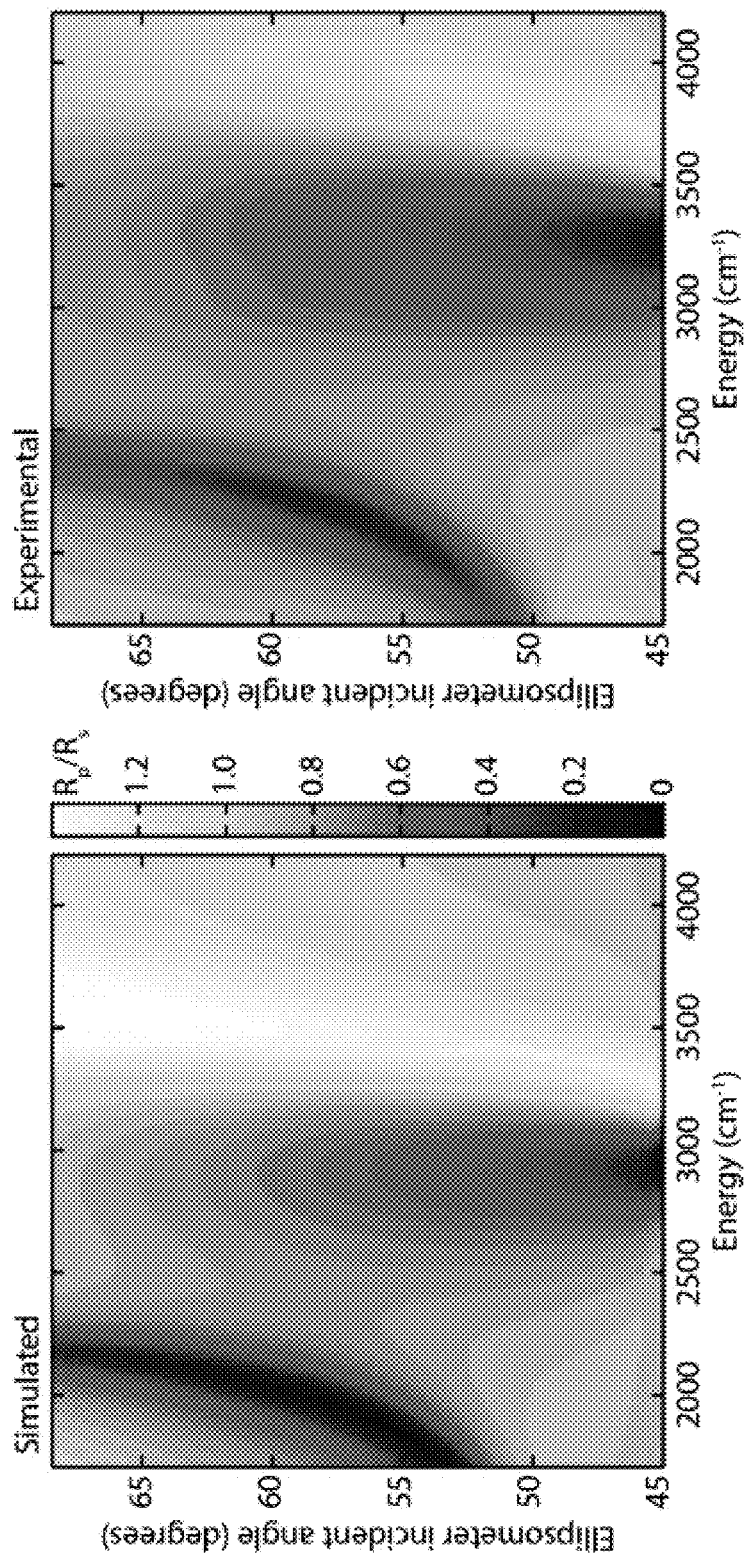
FIGS. 21A and 21B are graphs illustrating simulated and experimental mid-IR reflectivity maps, respectively, for a sample CdO:F film in accordance with further embodiments described herein.

In addition to supporting ENZ modes, F:CdO films in accordance with some embodiments of the present disclosure can also support surface plasmon polariton resonance (SPPR) provided the film thickness is an appreciable fraction of the skin depth, for example, approximately or greater than ($\geq$) 300-500 nm. FIGS. 21A and 21B illustrate simulated and experimental reflectivity maps, respectively, of a 580 nm thick F:CdO film with $9 \times 10^{19}$ $e^-/cm^{-3}$, 430 $cm^2/V$'s, showing angle-dependent extinction characteristic of surface plasmon polariton resonance. In particular, a 580 nm thick F:CdO film with $9\times10^{19}$ e$^-$/cm$^{-3}$ and a mobility of 430 cm$^2$/V·s was grown to observe mid-IR SPPR using IR-VASE. The dark absorption band at 1800-2300 cm$^{-1}$ is strongly dispersive and angle dependent, which may be a clear signature of SPPR modes. As a result of the larger film thickness, a distinct interference fringe is observed at higher energy in this film, which is consistent with simulation.

Some embodiments as described herein illustrate that F:CdO is a high-performance plasmonic semiconductor. By controlling carrier concentration and thickness as described herein, the optical properties of F:CdO films can be manipulated to generate plasmonic ENZ and SPPR modes that are tunable across the mid-IR. Thanks to the high electronic mobilities achieved in embodiments of the present disclosure, the absorption bands are intense and sharp with high quality factors, and, particularly for ENZ modes, can offer nearly perfect light extinction. While some other TCOs, such as tin-doped indium oxide, can support SPPR and ENZ modes, the superior electronic properties of F:CdO may provide in stronger and narrower absorption features with finer control over the resonance energy. Gold-based metamaterials and devices offer another point of comparison, but may require extensive patterning to support spoof plasmons or perfect absorption in the IR, with additional complexity required for tunability, and the resulting optical features are broader and more strongly damped. In contrast, some embodiments of the present disclosure achieve sharp ENZ modes and near-perfect absorption using lithography-free, unpatterned, single sub-100 nm F:CdO films grown using reactive physical vapor deposition procedures. These results, in combination with Dy- and Y-doped CdO according to some embodiment described herein, cement this material as a versatile plasmonic host. With the even greater ease of fabrication and manufacturing afforded by doping with fluorine from the gas phase, F:CdO thin films can be a viable building block for metamaterials, plasmonic sensors, and other advanced optical devices operating in the mid-infrared.

Heteroepitaxial F:CdO films in accordance with specific, non-limiting embodiments of the present disclosure are prepared using reactive HiPIMS from a circular 2-inch metallic Cd target made from pure (99.9999%) Cd. The target is affixed to a magnetron sputter source in a high vacuum sputtering system with a turbomolecular pump (base pressure of about $5\times10^{-8}$ Torr). The sputtering pressure is adjusted to about 10 mTorr using a gate valve in front of the pump and flowing by Ar (at about 20 sccm) and $O_2$ (at about 14.4 sccm) as process gas. Fluorine doping is achieved by introducing pure tetrafluoromethane ($CF_4$) gas into the chamber using a vacuum leak valve and an ion gauge to set a background base pressure of $CF_4$ prior to introducing the process gas. The HiPIMS plasma is controlled using a pulsed power module, with a pulse width of about 80 µs and a repetition rate of about 800 Hz. The HiPIMS controller is driven by a DC power supply. Deposition rate is controlled by the DC power supply current, generally fixed at about 140 mA, and film thickness is controlled by deposition time. At this current, voltages ranging from about 380V-400V are delivered to the HiPIMS controller, resulting in an average sputtering power of about 30 W delivered to the Cd target as measured by the HiPIMS controller.

Films in accordance with specific, non-limiting embodiments of the present disclosure are grown on epitaxial-polished r-plane sapphire substrates affixed to a stainless steel sample holder using silver paint. Prior to and during deposition, the sample holder and substrates are heated to about 455° C. using a radiative sample heater in the deposition chamber. The substrate temperature is measured using a 1.6 µm MM series pyrometer. Samples can be annealed after deposition for one hour at 700° C. in pure oxygen.

Electronic properties of the films in accordance with specific, non-limiting embodiments of the present disclosure are measured using a Hall measurement system with a 0.51 T magnet. Film thickness is measured by x-ray reflectivity using XRD in parallel beam geometry with a double-bounce hybrid monchromator and a parallel-plate collimator. Symmetric 2θ-ω scans, rocking curves, and φ scans are collected using the same geometry. Reciprocal space maps are collected using parallel beam geometry and an area detector. IR reflectivity data are measured on F:CdO films deposited on double side polished r-plane sapphire in the Kretschmann configuration. An IR-VASE ellipsometer is used in conjunction with a sample holder and a right-angle $CaF_2$ prism to couple light into the plasmonic films from the back surface of the substrate. An index matching fluid (n=1.720) is used between the prism and substrate for good light coupling.

It will be understood that the above descriptions with respect to specific process parameters, substrates, and equipment are provided by way of example only, and that embodiments of the present disclosure are not so limited.

Crystallographic orientation in conductive metal oxide films and/or growth substrates according to some embodiments of the present invention is described herein with reference to Miller indices. As used herein, Miller indices in square brackets, such as [100], denote a direction, while Miller indices in angle brackets or chevrons, such as <100>, denote a family of directions that are equivalent due to crystal symmetry. For example, <100> refers to the [100], [010], [001] directions and/or the negative of any of these directions, noted as the [100], [010], [001] directions (where negative terms in Miller indices are noted with a bar over the number that is negative). Miller indices in parentheses, such as (100), denote a plane. The normal to the (100) plane is the direction [100]. Miller indices in curly brackets or braces, such as {100}, denote a family of planes that are equivalent due to crystal symmetry, in a manner similar to the way angle brackets denote a family of directions. In hexagonal crystal systems, the Miller indices may be described in accordance with Miller-Bravais notation (hkil) where i=−(h+k), with the i parameter being redundant and thus often abbreviated with a ".".

Various embodiments have been described herein with reference to the accompanying drawings in which example embodiments are shown. These embodiments may, however, be embodied in different forms and should not be construed as limited to the embodiments set forth herein. Rather, these embodiments are provided so that this disclosure is thorough and complete and fully conveys the inventive concepts to those skilled in the art. Various modifications to the example embodiments and the generic principles and features described herein will be readily apparent. In the drawings, the sizes and relative sizes of layers and regions are not shown to scale, and in some instances may be exaggerated for clarity.

The example embodiments are mainly described in terms of particular methods and devices provided in particular implementations. However, the methods and devices may operate effectively in other implementations. Phrases such as "example embodiment", "one embodiment" and "another embodiment" may refer to the same or different embodiments as well as to multiple embodiments. The embodiments will be described with respect to systems and/or devices having certain components. However, the systems and/or devices may include fewer or additional components than those shown, and variations in the arrangement and type of the components may be made without departing from the scope of the inventive concepts. The example embodiments will also be described in the context of particular methods having certain steps or operations. However, the methods and devices may operate effectively for other methods having different and/or additional steps/operations and steps/operations in different orders that are not inconsistent with the example embodiments. Thus, the present inventive concepts are not intended to be limited to the embodiments shown, but are to be accorded the widest scope consistent with the principles and features described herein.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

Spatially relative terms, such as "beneath," "below," "lower," "above," "upper," and the like, may be used herein for ease of description to describe one element's or feature's relationship to another element(s) or feature(s) as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concepts.

It will also be understood that when an element is referred to as being "on" or "connected" to another element, it can be directly on or connected to the other element, or intervening elements may be present. In contrast, when an element is referred to as being "directly on" or "directly connected" to another element, there are no intervening elements present. In no event, however, should "on" or "directly on" be construed as requiring a layer to completely cover an underlying layer.

Embodiments are described herein with reference to cross-sectional and/or perspective illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the disclosure and, although specific terms are employed, they are used in a generic and descriptive sense only, the scope of the present invention being set forth in the following claims.

The invention claimed is:

1. A method of forming a metal oxide, the method comprising:
   providing a substrate in a chamber;
   providing a reactive deposition atmosphere defining a total atmosphere in the chamber comprising an oxygen concentration of greater than about 20 percent in a gas phase;
   applying a pulsed DC signal to a sputtering target comprising a metal to sputter metal particles therefrom; and
   depositing an electrically conductive metal oxide film comprising an oxide of the metal on the substrate responsive to a reaction between the metal particles and the reactive deposition atmosphere.

2. The method of claim 1, wherein the pulsed DC signal is generated by a high power impulse magnetron sputtering (HiPIMS) power supply.

3. The method of claim 1, further comprising:
   supplying, into the reactive deposition atmosphere, a doping element from a doping source, wherein the doping element is different than the metal of the sputtering target,
   wherein the reaction between the metal particles, the reactive deposition atmosphere, and the doping element is configured to control carrier concentration and/or carrier mobility of the conductive metal oxide film.

4. A method of forming a metal oxide, the method comprising:

providing a substrate in a chamber;
providing a reactive deposition atmosphere defining a total atmosphere in the chamber comprising an oxygen concentration of greater than about 20 percent;
applying a pulsed DC signal to a sputtering target comprising a metal to sputter metal particles therefrom;
supplying a doping element from a doping source; and
depositing an electrically conductive metal oxide film comprising an oxide of the metal on the substrate responsive to a reaction between the metal particles, the reactive deposition atmosphere, and the doping element,
wherein the reaction is configured to control carrier concentration and/or carrier mobility of the conductive metal oxide film at a thickness as low as about 10 nanometers (nm),
wherein the carrier concentration is in a range from intrinsic n-type concentration to about $5 \times 10^{20}$ cm$^{-3}$, and wherein the carrier mobility is about 300-550 cm$^2$/(V·s).

5. The method of claim 4, wherein the thickness of the conductive metal oxide film is about 10 nanometers (nm) to about 3 micrometers (μm), and wherein the conductive metal oxide film has an RMS roughness of about 5 nanometers (nm) or less.

6. The method of claim 5, wherein a deposition rate of the conductive metal oxide film is about 10 nanometers (nm) per minute or more.

7. The method of claim 3, wherein the doping source is a solid-phase target comprising Ag, In, Ce, Sn, Y, or F compound, or a gaseous-phase organic or metal organic doping source comprising CF$_4$ or other metal ions.

8. The method of claim 7, wherein the doping element is generated by RF sputtering or HiPIMS.

9. The method of claim 3, further comprising:
performing a post-deposition anneal of the conductive metal oxide film, wherein the post-deposition anneal comprises a temperature, a duration, and/or an atmospheric condition that is configured to increase organization of a crystal structure of the conductive metal oxide film, smooth surface properties of the conductive metal oxide film, change a carrier concentration of the conductive metal oxide film, and/or increase a carrier mobility of the conductive metal oxide film.

10. The method of claim 9, wherein the temperature comprises about 600 to about 700 degrees Celsius (C), and wherein the duration does not exceed about one hour, or about 30 minutes.

11. The method of claim 9, wherein the metal comprises cadmium (Cd), and wherein the atmospheric condition comprises a static oxygen supply, a dynamic oxygen supply, a volume of the chamber, and/or a Cd partial pressure of the chamber.

12. The method of claim 3, wherein the doping element comprises indium (In) or yttrium (Y).

13. The method of claim 1, wherein the oxide of the metal comprises CdO, In$_2$O$_3$, SnO$_2$, BaSnO$_3$, or ZnO.

14. The method of claim 13, wherein the substrate comprises glass, quartz (SiO$_2$), sapphire (c-plane or r-plane), polycrystalline Alumina, MgO, Si, platinized Si, GaN, ZnO on c-plane sapphire, ZnO on Si, GaN on Si, or GaN on c-plane sapphire.

15. The method of claim 14, wherein the film defines a heterojunction with the substrate.

16. The method of claim 1, wherein the oxygen concentration is greater than about 40 percent, and wherein the total atmosphere in the chamber further comprises argon (Ar).

* * * * *

UNITED STATES PATENT AND TRADEMARK OFFICE
CERTIFICATE OF CORRECTION

PATENT NO. : 10,741,649 B2
APPLICATION NO. : 15/988883
DATED : August 11, 2020
INVENTOR(S) : Sachet et al.

It is certified that error appears in the above-identified patent and that said Letters Patent is hereby corrected as shown below:

On the Title Page

(56) References Cited, OTHER PUBLICATIONS, Page 2, Column 2, Line 3: Please correct "Soltasseva et al." to read -- Boltasseva et al. --

In the Specification

Column 5, Line 12: Please correct "(p)" to read -- (µs) --

Column 12, Line 55: Please correct "(0-20)" to read -- (Θ-2Θ) --

Column 15, Line 43: Please correct "AP" to read -- ΔP --

Column 15, Line 48: Please correct "AP" to read -- ΔP --

Column 15, Line 50: Please correct "AP" to read -- ΔP --

Column 17, Lines 50-53: Please correct "  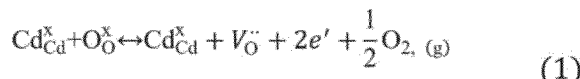 " to read 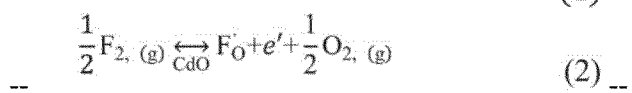 --

Column 18, Line 41: Please correct "20" to read -- 2Θ --

Signed and Sealed this
Twelfth Day of January, 2021

Andrei Iancu
*Director of the United States Patent and Trademark Office*

CERTIFICATE OF CORRECTION (continued)
U.S. Pat. No. 10,741,649 B2

Column 19, Line 26: Please correct "F" to read -- $F^-$ --

Column 19, Line 44: Please correct "F" to read -- $F^-$ --

Column 19, Line 51: Please correct "top(O$_2$)$^{-1/6}$" to read -- to $p(O_2)^{-1/6}$ --

Column 20, Line 20: Please correct " $\varepsilon(\omega) = \partial_\infty - \dfrac{\omega_p^2}{\omega^2 + l\omega\Gamma}$ (3) " to read -- $\varepsilon(\omega) = \varepsilon_\infty - \dfrac{\omega_p^2}{\omega^2 + i\omega\Gamma}$ (3) --

Column 20, Line 43: Please correct " $k_{z1}^2(\omega) = \varepsilon_i \dfrac{\omega^2}{\sigma^3} - k_{\parallel}^2$ " to read -- $k_{z,i}^2(\omega) = \varepsilon_i \dfrac{\omega^2}{c^2} - k_{\parallel}^2$ --

Column 20, Line 47: Please correct "$\varepsilon_t$" to read -- $\varepsilon_i$ --

Column 21, Line 6: Please correct " $d \ll \dfrac{\lambda_p}{\varepsilon\pi}$, " to read -- $d \ll \dfrac{\lambda_p}{5\pi}$, --

Column 22, Line 63: Please correct "($\geq$)" to read -- ($\gtrsim$) --

Column 22, Line 65: Please correct "430 cm$^2$/V's" to read -- 430 cm$^2$/V·s --

Column 24, Line 34: Please correct "[100], [010], [001]" to read -- $[\bar{1}00], [0\bar{1}0], [00\bar{1}]$ --